(12) United States Patent
Ou et al.

(10) Patent No.: US 7,723,757 B2
(45) Date of Patent: May 25, 2010

(54) VERTICAL NONVOLATILE MEMORY CELL, ARRAY, AND OPERATION

(75) Inventors: Tien Fan Ou, Taipei (TW); Wen-Jer Tsai, Hualien (TW); Hsuan Ling Kao, Taipei (TW); Yi Ying Liao, Sijhih (TW)

(73) Assignee: Macronix International Co., Ltd., Hsinchu (TW)

( * ) Notice: Subject to any disclaimer, the term of this patent is extended or adjusted under 35 U.S.C. 154(b) by 367 days.

(21) Appl. No.: 11/774,452

(22) Filed: Jul. 6, 2007

(65) Prior Publication Data

US 2008/0117677 A1    May 22, 2008

Related U.S. Application Data

(60) Provisional application No. 60/866,583, filed on Nov. 20, 2006.

(51) Int. Cl.
H01L 29/74 (2006.01)
(52) U.S. Cl. .............................. 257/225; 257/E21.662; 438/257

(58) Field of Classification Search ................. 257/225, 257/E21.662; 438/257
See application file for complete search history.

(56) References Cited

U.S. PATENT DOCUMENTS

| 6,160,286 A | 12/2000 | Chi et al. |
|---|---|---|
| 6,690,601 B2 | 2/2004 | Yeh et al. |
| 2006/0166473 A1* | 7/2006 | Kocon ........................ 438/570 |
| 2007/0025145 A1* | 2/2007 | Mokhlesi et al. ....... 365/185.01 |
| 2007/0133273 A1 | 6/2007 | Liao et al. |

* cited by examiner

Primary Examiner—Thao X Le
Assistant Examiner—Matthew Gordon
(74) Attorney, Agent, or Firm—Kenta Suzue; Haynes Beffel & Wolfeld LLP

(57) ABSTRACT

A vertical nonvolatile memory cell with a charge storage structure includes a charge control structure with three nodes. Example embodiments include the individual memory cell, an array of such memory cells, methods of operating the memory cell or array of memory cells, and methods of manufacturing the same.

26 Claims, 26 Drawing Sheets

VERTICAL NONVOLATILE MEMORY CELL, ARRAY, AND OPERATION

REFERENCE TO RELATED APPLICATION

This application claims the benefit of U.S. Provisional Patent Application No. 60/866,583, filed on 20 Nov. 2006, by inventors Tien-Fan Ou, Wen-Jer Tsai, Erh-Kun Lai, Hsuan-Ling Kao and Yi Ying Liao entitled Gated Diode Nonvolatile Memory.

BACKGROUND

1. Field

The present invention relates to electrically programmable and erasable non-volatile memory, and more particularly to charge storage memory with a bias arrangement that reads the contents of the charge storage structure of the memory cell with great sensitivity.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Various memory cell structures based on charge trapping dielectric layers include structures known by the industry names PHINES, NROM, and SONOS, for example. These memory cell structures store data by trapping charge in a charge trapping dielectric layer, such as silicon nitride. As more net negative charge is trapped, the threshold voltage of the memory cell increases. The threshold voltage of the memory cell is reduced by removing negative charge from, or adding positive charge to, the charge trapping layer.

Conventional memory cell structures rely on a transistor structure with source, drain, and gate. However, common transistor structures have drain and source diffusions that are laterally separated from each other by a self-aligned gate. This lateral separation is a factor that resists further miniaturization of nonvolatile memory.

Thus, a need exists for a nonvolatile memory cell that is open to further miniaturization and whose contents can be read with great sensitivity.

SUMMARY

One aspect of the technology is an integrated circuit of a nonvolatile memory device storing data. The integrated circuit includes one or more charge storage structures, one or more storage dielectric structures, and a charge control structure.

In various embodiments, the charge storage structures includes: floating gate material, charge trapping material, and/or nanocrystal material.

The charge storage structures have a first location storing a first charge storage state and a second location storing a second charge storage state. The first charge storage state and the second charge storage state represent the data such that the first charge storage state and the second charge storage state each represent at least one bit of the data. In various embodiments, each charge storage state stores one bit, or multiple bits.

The storage dielectric structures are:

1) at least partly between the first location of the one or more charge storage structures and a charge control structure, 2) at least partly between the second location of the one or more charge storage structures and the charge control structure, 3) at least partly between the first location of the one or more charge storage structures and a source of gate voltage, and 4) at least partly between the second location of the one or more charge storage structure and the source of gate voltage.

The charge control structure has a first node having a first charge type, a second node having a second charge type opposite to the first charge type, and a third node having the first charge type. In some embodiments, the first charge type of the first node and the third node is n-type, and the second charge type of the second node is p-type. In other embodiments, the first charge type of the first node and the third node is p-type, and the second charge type of the second node is n-type. In some embodiments, at least one of the junctions separating two of the nodes includes a Schottky junction. In various embodiments, the charge control structure includes at least one of Si, polysilicon, Ge, and SiGe.

The charge control structure also has a first junction separating the first node and the second node, and a second junction separating the second node and the third node. The first junction is adjacent to a part of the one or more storage dielectric structures at least partly between the first location of the one or more charge storage structures and the charge control structure. The second junction is adjacent to a part of the one or more storage dielectric structures at least partly between the second location of the one or more charge storage structures and the charge control structure. In various embodiments, the first junction and the second junction are at least one of single crystal and polycrystalline.

In some embodiments, the first junction includes a first diffusion barrier junction, and the second junction includes a second diffusion barrier junction. In some embodiments, at least part of the first diffusion barrier junction by the one or more storage dielectric structures is no more than about 20 Angstroms thick, and at least part of the second diffusion barrier junction by the one or more storage dielectric structures is no more than about 20 Angstroms thick.

The charge control structure is vertically oriented with respect to a substrate of the integrated circuit, such that in a cross-section of the nonvolatile memory device, the second node and the third node are further from the substrate than the first node, and the third node is further from the substrate than the second node.

In some embodiments, the nonvolatile memory device has a cross-section in which the nonvolatile memory device is separated from neighboring nonvolatile memory devices of the integrated circuit by the source of gate voltage.

Some embodiments further include logic coupled to the charge control structure, which applies a variety of bias arrangements to control the device. Various bias arrangements:

1) control at least one of the first charge storage state and the second charge storage state, by causing electrons to tunnel from the source of gate voltage to said one or more charge storage structures, 2) control at least one of the first charge storage state and the second charge storage state, by causing electrons to tunnel from the charge control structure to said one or more charge storage structures.

3) control at least one of the first charge storage state and the second charge storage state, by causing holes to tunnel from the source of gate voltage to said one or more charge storage structures.

4) control at least one of the first charge storage state and the second charge storage state, by causing holes to tunnel from the charge control structure to said one or more charge storage structures.

5) control a selected one of the first charge storage state and the second charge storage state, by causing band-to-band tunneling of hot holes from the charge control structure to said one or more charge storage structures.

6) control a selected one of the first charge storage state and the second charge storage state, by causing band-to-band tunneling of hot electrons from the charge control structure to said one or more charge storage structures.

7) control a selected one of the first charge storage state and the second charge storage state, by causing channel hot electron movement from the charge control structure to said one or more charge storage structures.

8) control a selected one of the first charge storage state and the second charge storage state, by causing channel hot hole movement from the charge control structure to said one or more charge storage structures.

9) determine selectively one of the first charge storage state and the second charge storage state and measure band-to-band current flowing through the charge control structure to selectively determine one of the first charge storage state and the second charge storage state.

10) determine selectively one of the first charge storage state and the second charge storage state and measure channel current flowing through the charge control structure to determine selectively one of the first charge storage state and the second charge storage state.

Another aspect of the technology is an array of nonvolatile memory devices as described herein.

DETAILED DESCRIPTION

Figure 1:
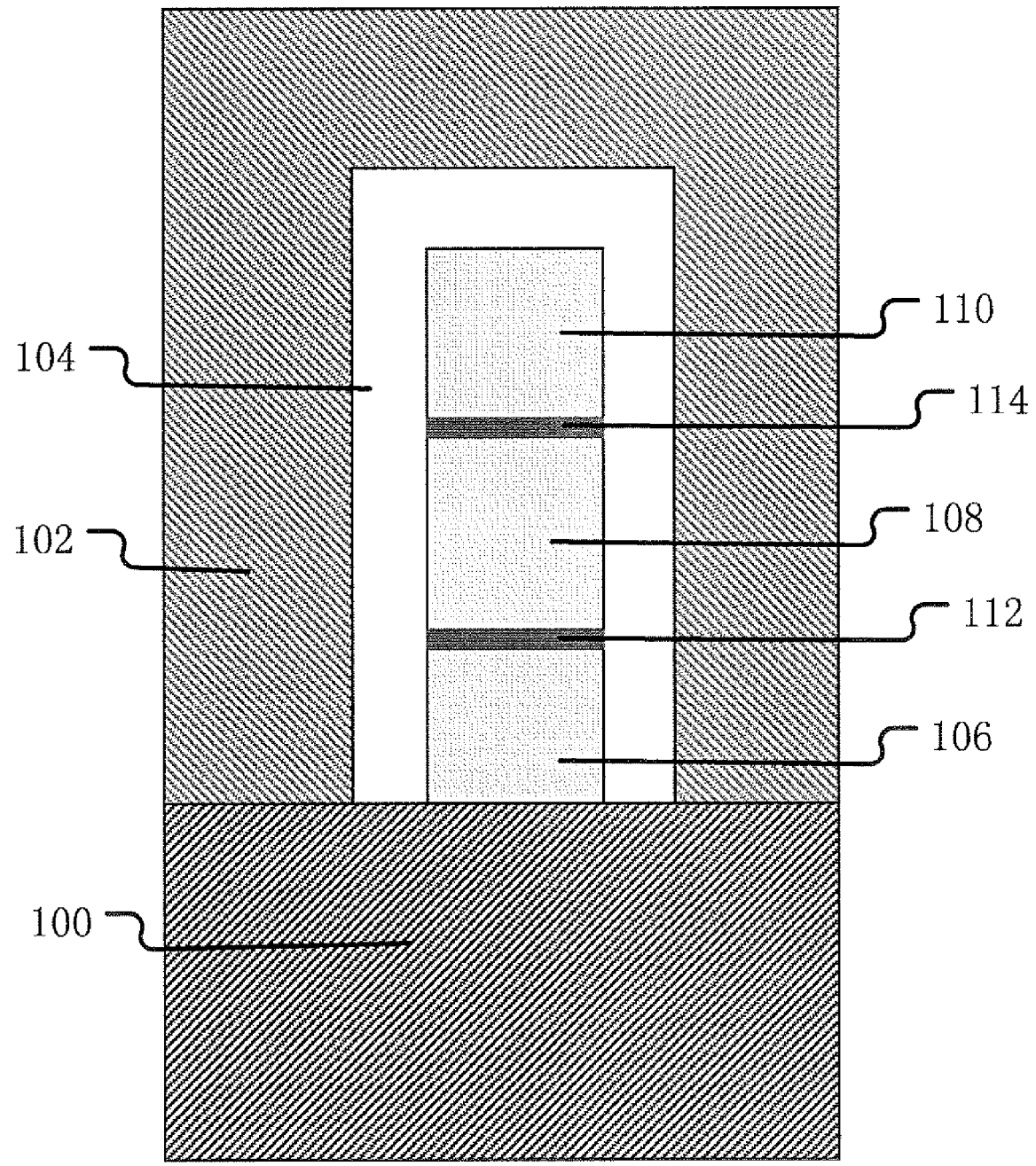
FIG. 1 is a simplified diagram of a vertical nonvolatile memory cell.

FIG. 1 is a simplified diagram of a vertical nonvolatile memory cell, which has an internal charge control structure with vertically stacked nodes 106, 108, and 110. Nodes 106 and 108 have opposite charge types, and are separated by junction 112, which includes a diffusion barrier junction. Nodes 110 and 108 have opposite charge types, and are separated by junction 114, which also includes a diffusion barrier junction. Nodes 106, 108, and 110 can be doped semiconductor regions, and include Schottky contacts. A combined charge storage and dielectric structure 104 substantially surrounds nodes 106, 108, and 110. In turn, the gate 102 substantially surrounds the combined charge storage and dielectric structure 104. The charge control structure with nodes, the combined charge storage and dielectric structure 104, and the gate 102 are formed on isolation dielectric 100. The vertical nonvolatile memory cell is isolated from neighboring devices, such as other vertical nonvolatile memory cells (not shown), by the gate 102.

One example material of the charge storage structure is charge trapping material. Representative dielectrics between a charge trapping material structure and the gate include silicon dioxide and silicon oxynitride having a thickness of about 5 to 10 nanometers, or other similar high dielectric constant materials including for example $Al_2O_3$. Representative dielectrics between a charge trapping material structure and the charge control structure include silicon dioxide and silicon oxynitride having a thickness of about 2 to 10 nanometers, or other similar high dielectric constant materials.

Representative charge trapping structures include silicon nitride having a thickness of about 3 to 9 nanometers, or other similar high dielectric constant materials, including metal oxides such as $Al_2O_3$, $HfO_2$, and others.

In some embodiments, the gate comprises a material having a work function greater than the intrinsic work function of silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the outer dielectric is around 3.15 eV. Thus, embodiments of the present technology use materials for the gate and for the outer dielectric having an injection barrier higher than about 3.15 eV, such as higher than about 3.4 eV, and preferably higher than about 4 eV. For p-type polysilicon gates with silicon dioxide outer dielectrics, the injection barrier is about 4.25 eV, and the resulting threshold of a converged cell is reduced about 2 volts relative to a cell having an n-type polysilicon gate with a silicon dioxide outer dielectric.

Each charge storage state can represent one bit or multiple bits. For example, if each charge storage state stores two bits, then there are four discrete levels of charge stored by the charge storage state.

The diffusion barrier junction can be thin oxide, SiN, of SiON, and serves to block thermally induced diffusion of dopants between the nodes of the charge control structure. The diffusion barrier is sufficiently thin to permit direct tunneling of charge with sufficient voltage.

In some embodiments, programming refers to making more positive the net charge stored in the charge trapping structure, such as by the addition of holes to or the removal of electrons from the charge storage structure; and erasing refers to making more negative the net charge stored in the charge storage structure, such as by the removal of holes from or the addition of electrons to the charge trapping structure. However, in other embodiments programming refers to making the net charge stored in the charge storage structure more negative, and erasing refers to making the net charge stored in the charge storage structure more positive. Various charge movement mechanisms are used, such as band-to-band tunneling induced hot carrier injection, E-field induced tunneling, and direct tunneling from the substrate.

Figure 2:
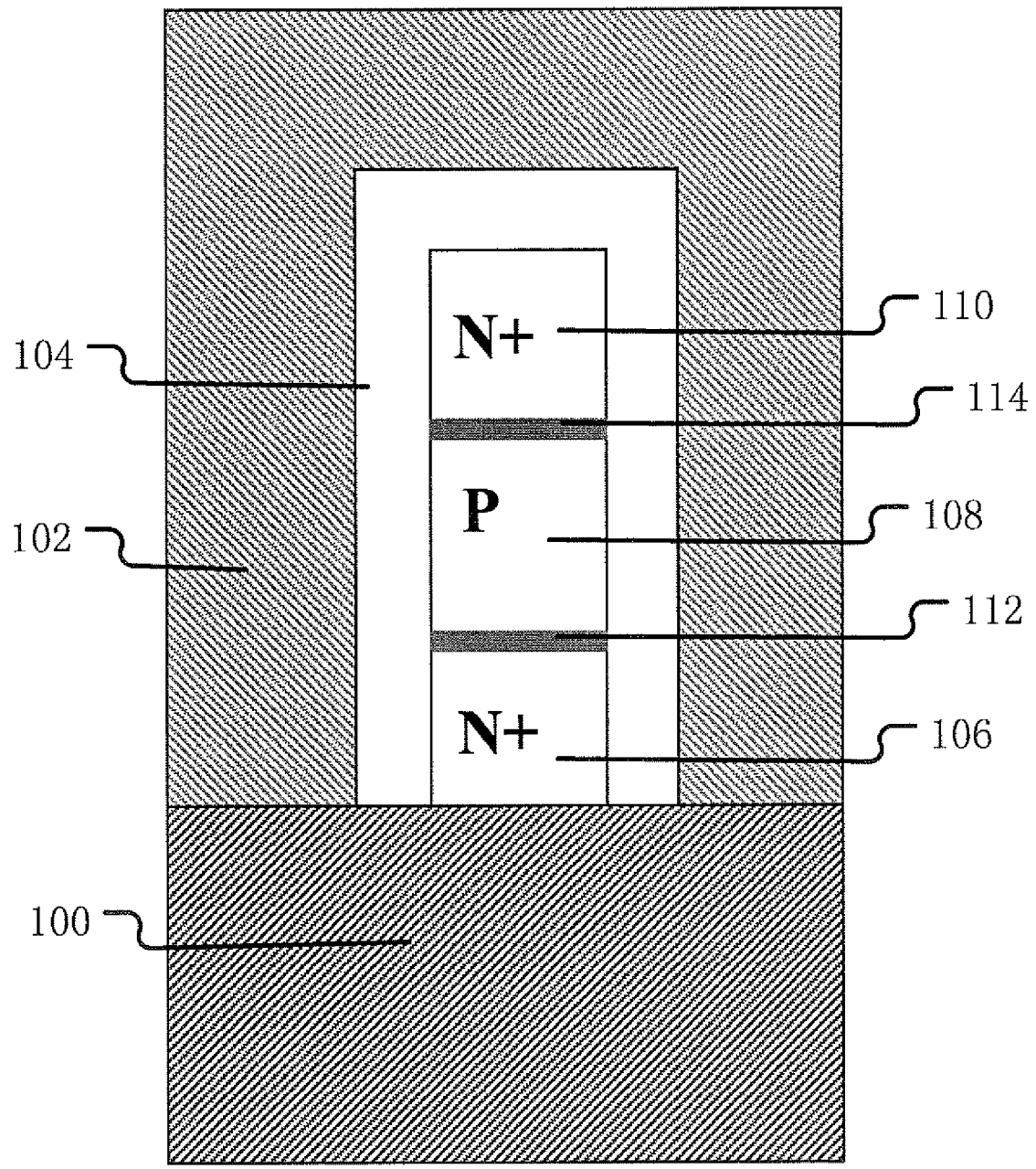
FIG. 2 is a simplified diagram of a vertical nonvolatile memory cell, showing a charge control structure with an n+/p/n+ stack of material with diffusion barriers separating neighboring nodes of the stack.

FIG. 2 is a simplified diagram of a vertical nonvolatile memory cell, showing a charge control structure with an n+/p/n+ stack of material with diffusion barriers separating neighboring nodes of the stack. Nodes 106/108/110 are respectively doped n+/p/n+.

Figure 3:
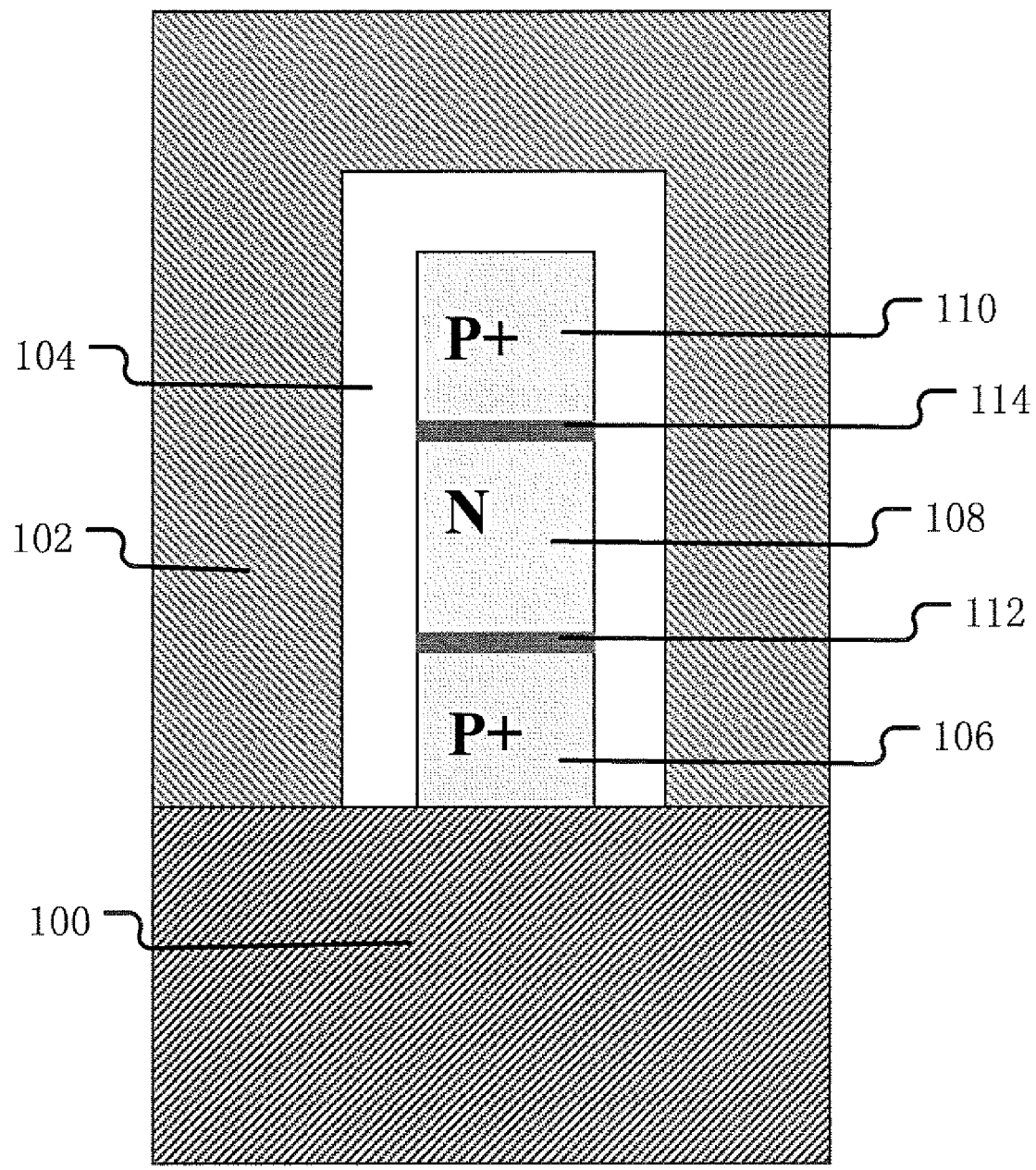
FIG. 3 is a simplified diagram of a vertical nonvolatile memory cell, showing a charge control structure with a p+/n/p+ stack of material with diffusion barriers separating neighboring nodes of the stack.

FIG. 3 is a simplified diagram of a vertical nonvolatile memory cell, showing a charge control structure with a p+/n/p+ stack of material with diffusion barriers separating neighboring nodes of the stack. Nodes 106/108/110 are respectively doped p+/n/p+.

Alternative materials for nodes 106, 108, 110 are Si, polysilicon, Ge, and SiGe. The junction can be single crystal or polycrystalline. Polycrystalline materials support high memory density, by stacking multiple vertical layers. Because of the smaller bandgap of germanium compared to silicon, the vertical nonvolatile memory cell tends to generate a greater band-to-band current with germanium.

Figure 4:
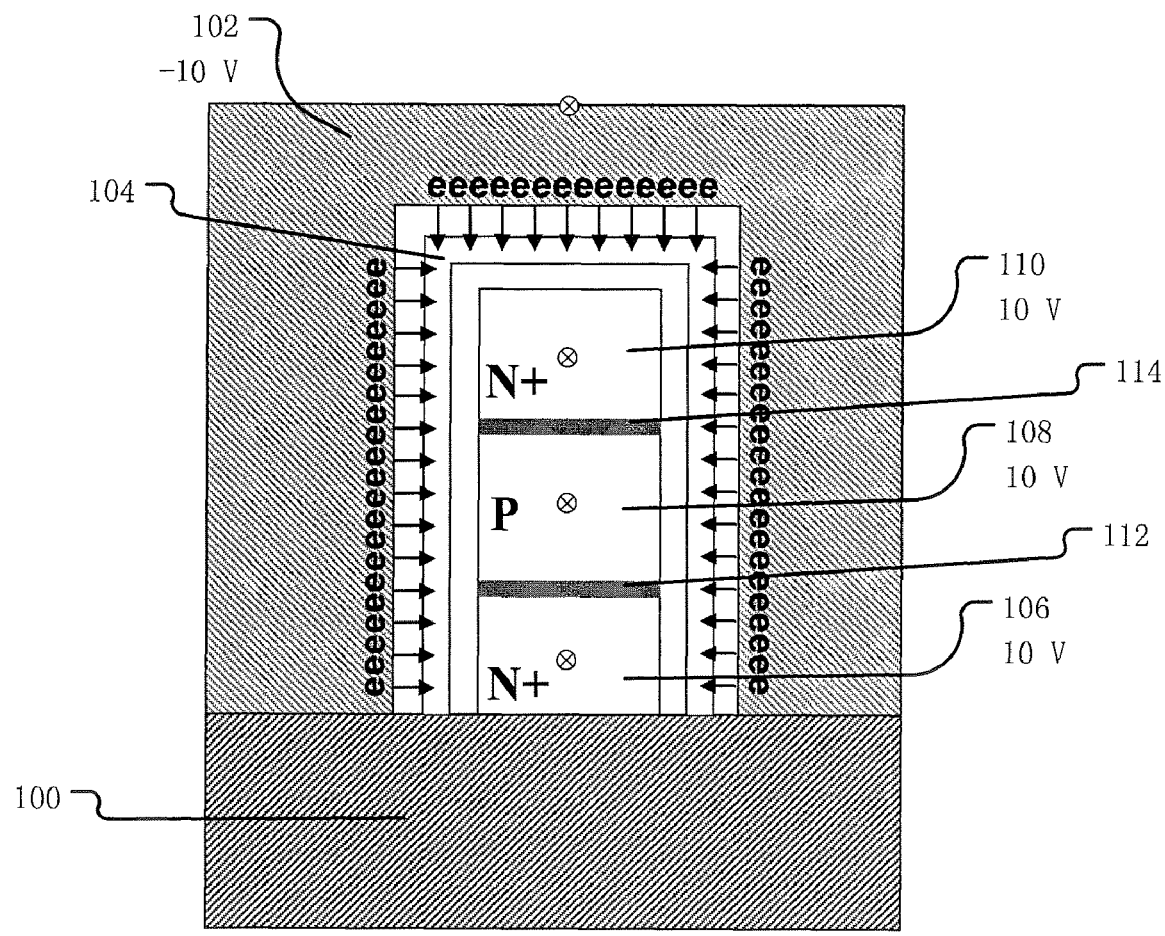
FIG. 4 is a simplified diagram of a vertical nonvolatile memory cell operation performing electron tunnel injection in a direction from the gate to the charge storage structure.

FIG. 4 is a simplified diagram of a vertical nonvolatile memory cell operation performing electron tunnel injection in a direction from the gate to the charge storage structure. The gate 102, node 110, node 108, and node 106 have respective voltages −10 V, 10 V, 10 V, and 10 V.

Figure 5:
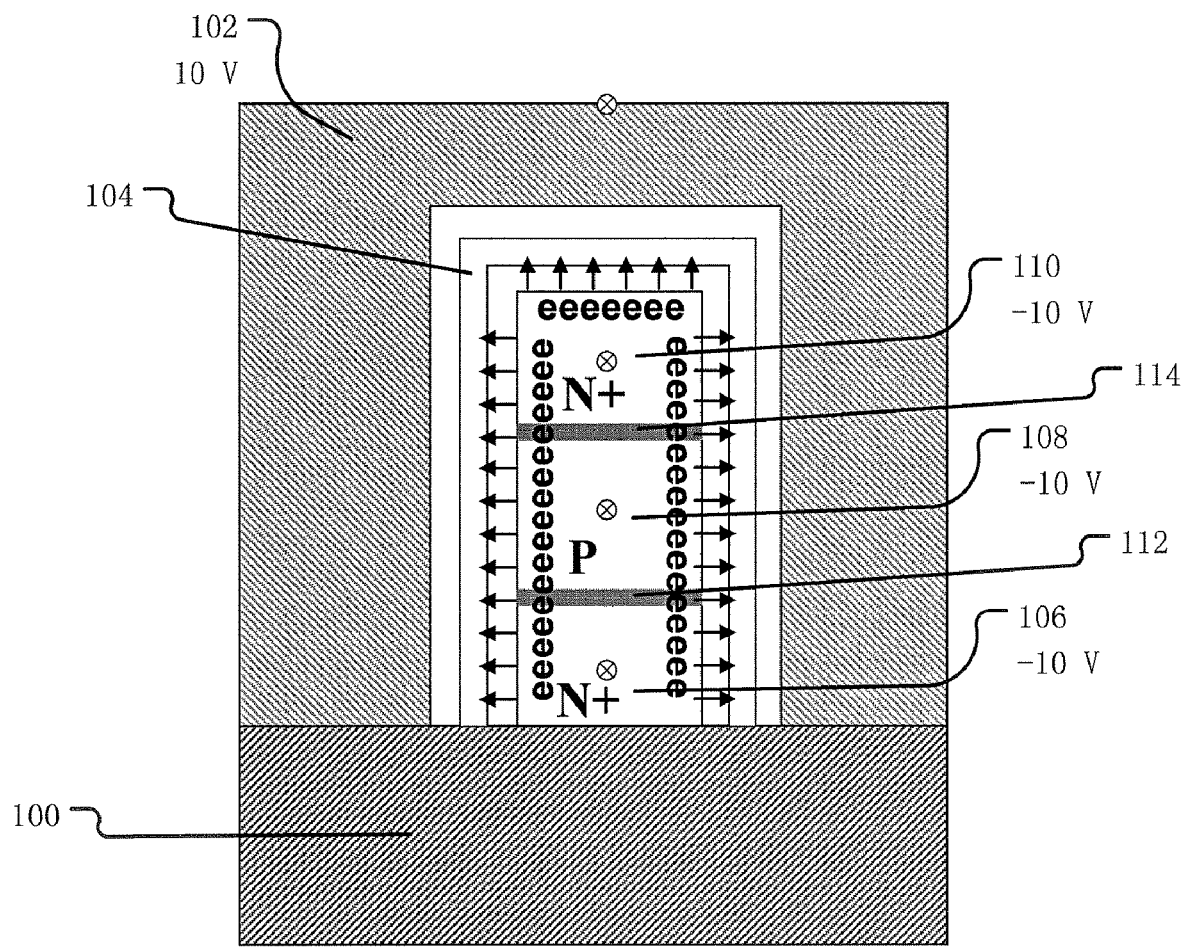
FIG. 5 is a simplified diagram of a vertical nonvolatile memory cell operation performing electron tunnel injection in a direction from the charge control structure to the charge storage structure.

FIG. 5 is a simplified diagram of a vertical nonvolatile memory cell operation performing electron tunnel injection in a direction from the charge control structure to the charge storage structure. The gate 102, node 110, node 108, and node 106 have respective voltages 10 V, −10 V, −10 V, and −10 V.

Figure 6:
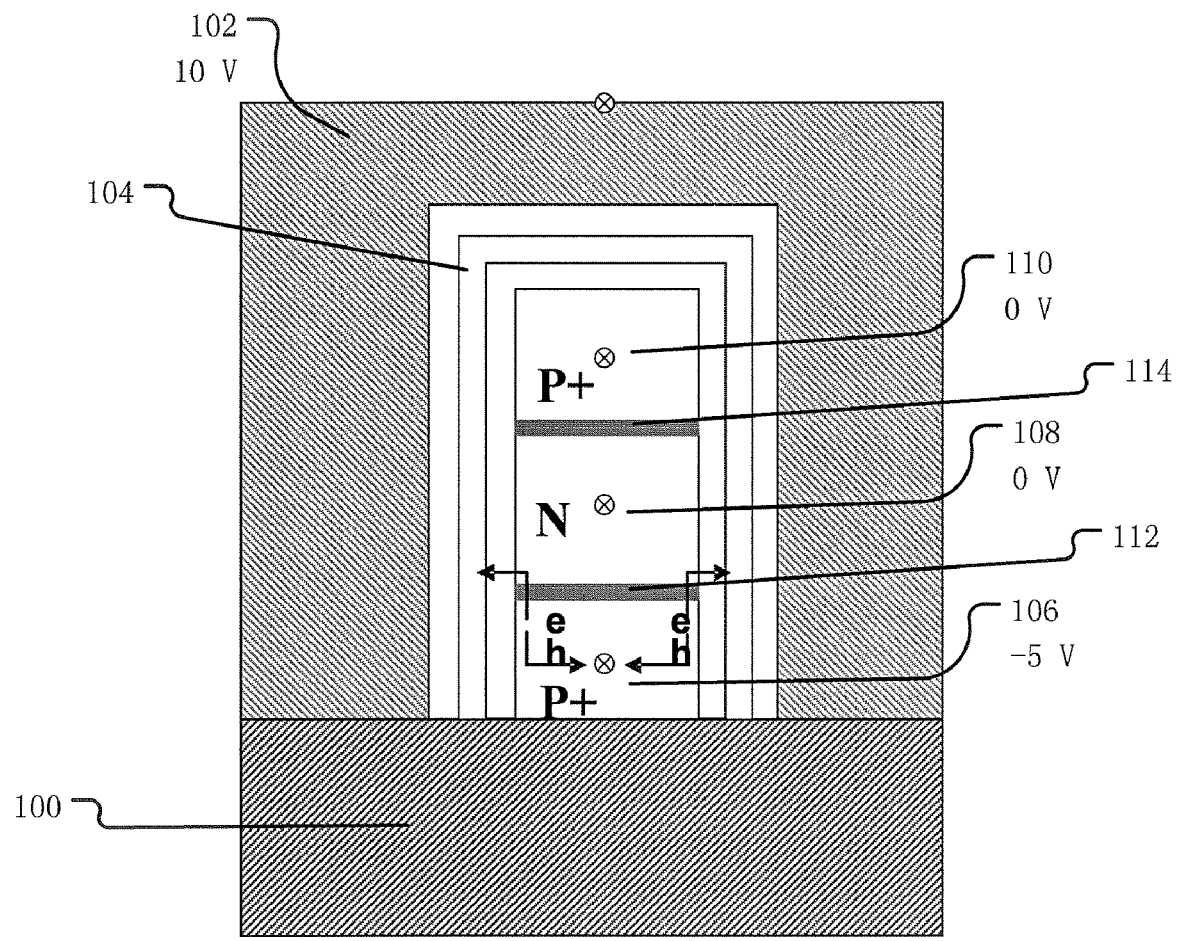
FIG. 6 is a simplified diagram of a vertical nonvolatile memory cell operation performing band-to-band hot electron injection into a part of the charge storage structure by the lower p+/n junction.

FIG. 6 is a simplified diagram of a vertical nonvolatile memory cell operation performing band-to-band hot electron injection into a part of the charge storage structure by the lower p+/n junction. The gate 102, node 110, node 108, and node 106 have respective voltages 10 V, 0 V, 0 V, and −5 V. From the resulting electron-hole pairs, as the electrons move into the charge storage structure, the holes move into node 106.

Figure 16:
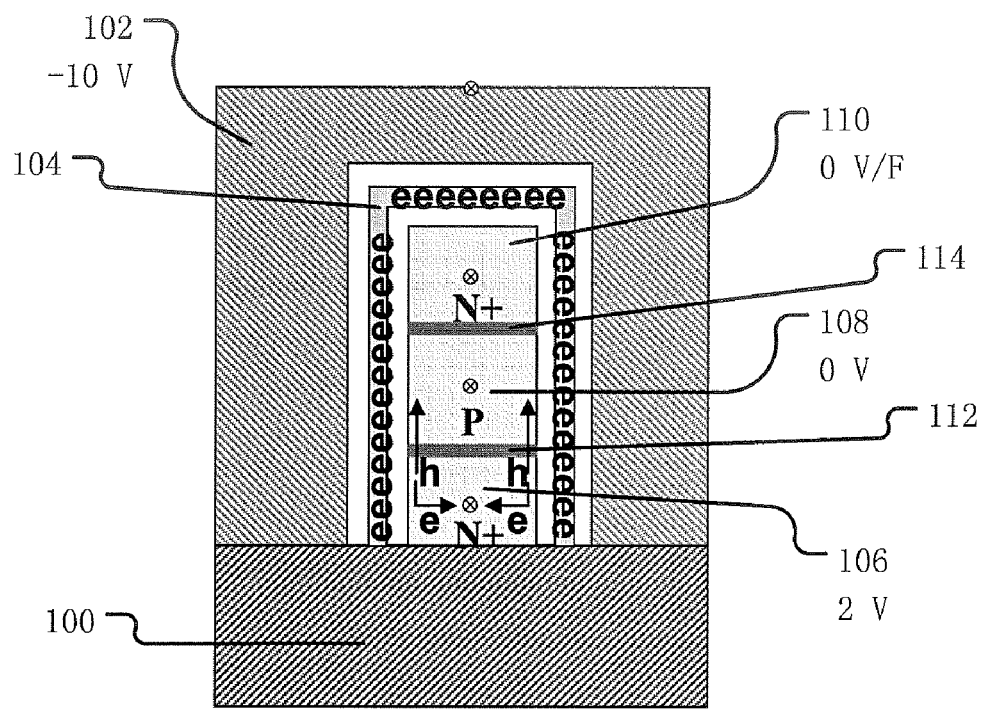
FIG. 16 is a simplified diagram of a vertical nonvolatile memory cell operation performing band-to-band sensing on the charge storage state corresponding to a part of the charge storage structure by the lower n+/p junction, where the charge storage state reflects relatively negative net charge.

See the discussion on band-to-band currents following FIG. 16, in the context of a read operation. Unlike the read operation, the operation of FIG. 6 has a larger reverse bias between nodes of the charge control structure, so that the charge has sufficient energy to transit the intervening dielectric/oxide and move to the charge storage structure.

Figure 7:
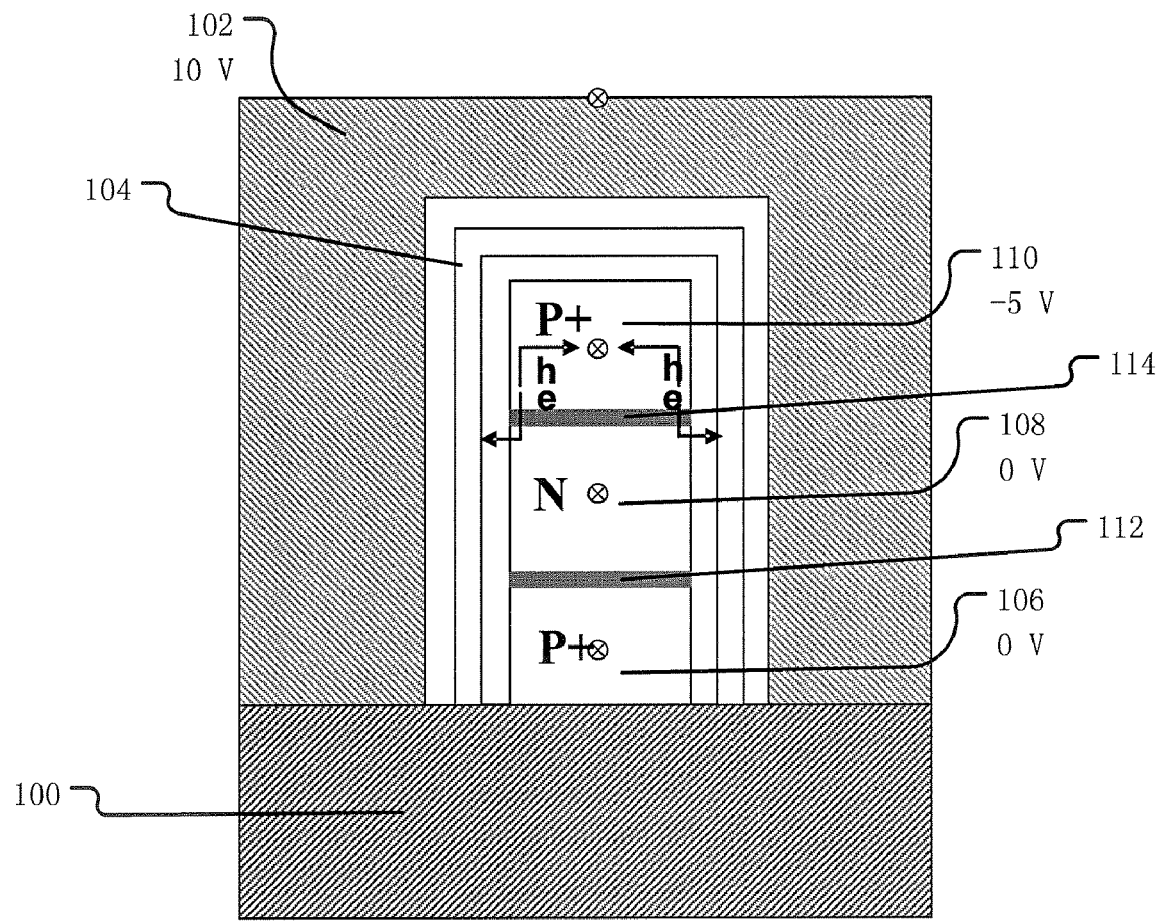
FIG. 7 is a simplified diagram of a vertical nonvolatile memory cell operation performing band-to-band hot electron injection into a part of the charge storage structure by the upper p+/n junction.

FIG. 7 is a simplified diagram of a vertical nonvolatile memory cell operation performing band-to-band hot electron injection into a part of the charge storage structure by the upper p+/n junction. The gate 102, node 110, node 108, and node 106 have respective voltages 10 V, −5 V, 0 V, and 0 V. From the resulting electron-hole pairs, as the electrons move into the charge storage structure, the holes move into node 110.

Figure 8:
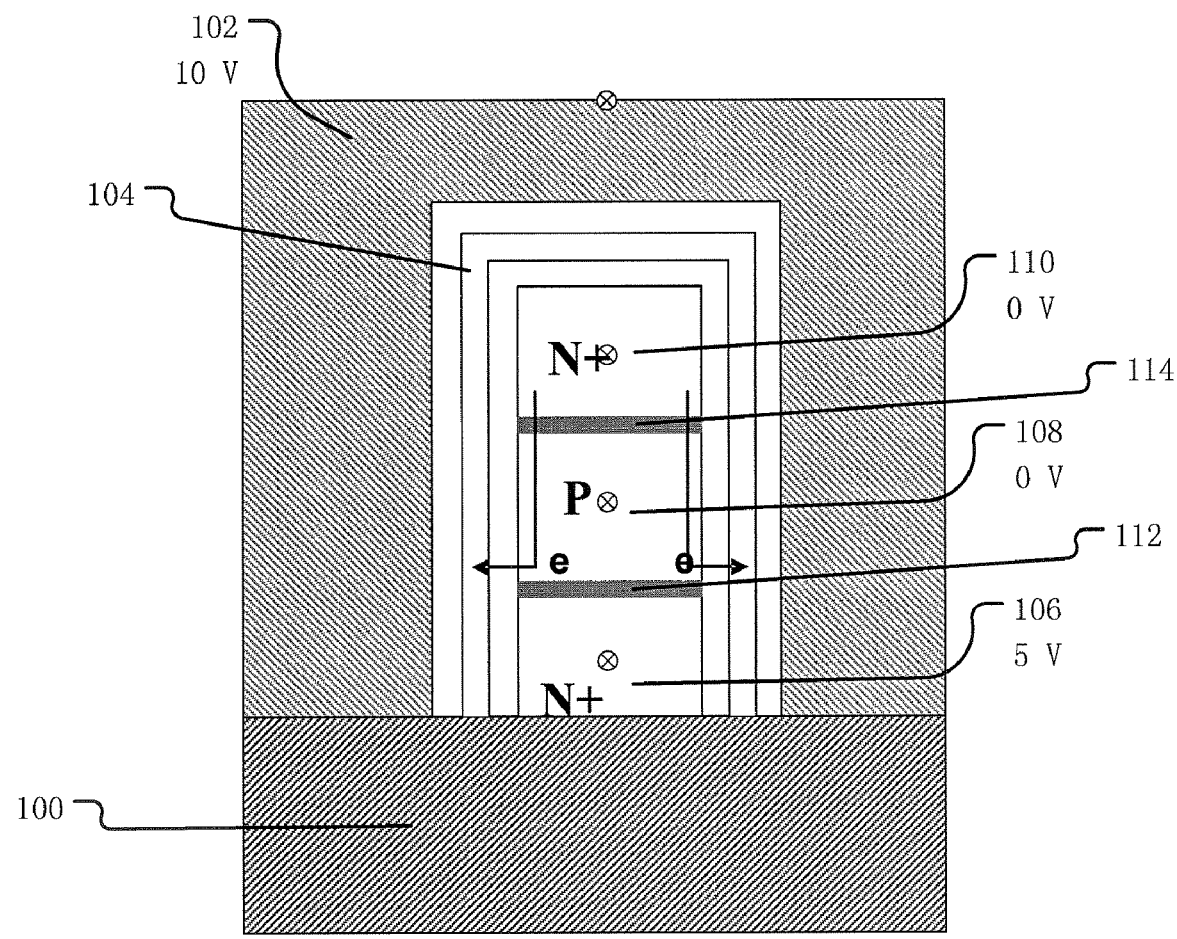
FIG. 8 is a simplified diagram of a vertical nonvolatile memory cell operation performing channel hot electron injection into a part of the charge storage structure by the lower n+/p junction.

FIG. 8 is a simplified diagram of a vertical nonvolatile memory cell operation performing channel hot electron injection into a part of the charge storage structure by the lower n+/p junction. The gate 102, node 110, node 108, and node 106 have respective voltages 10 V, 0 V, 0 V, and 5 V.

Channel hot injection occurs by causing an inversion in the "channel" which is part of the middle node 108, and accelerating charge through this channel until the charge has sufficient energy to transit the intervening dielectric/oxide and move to the charge storage structure.

Figure 9:
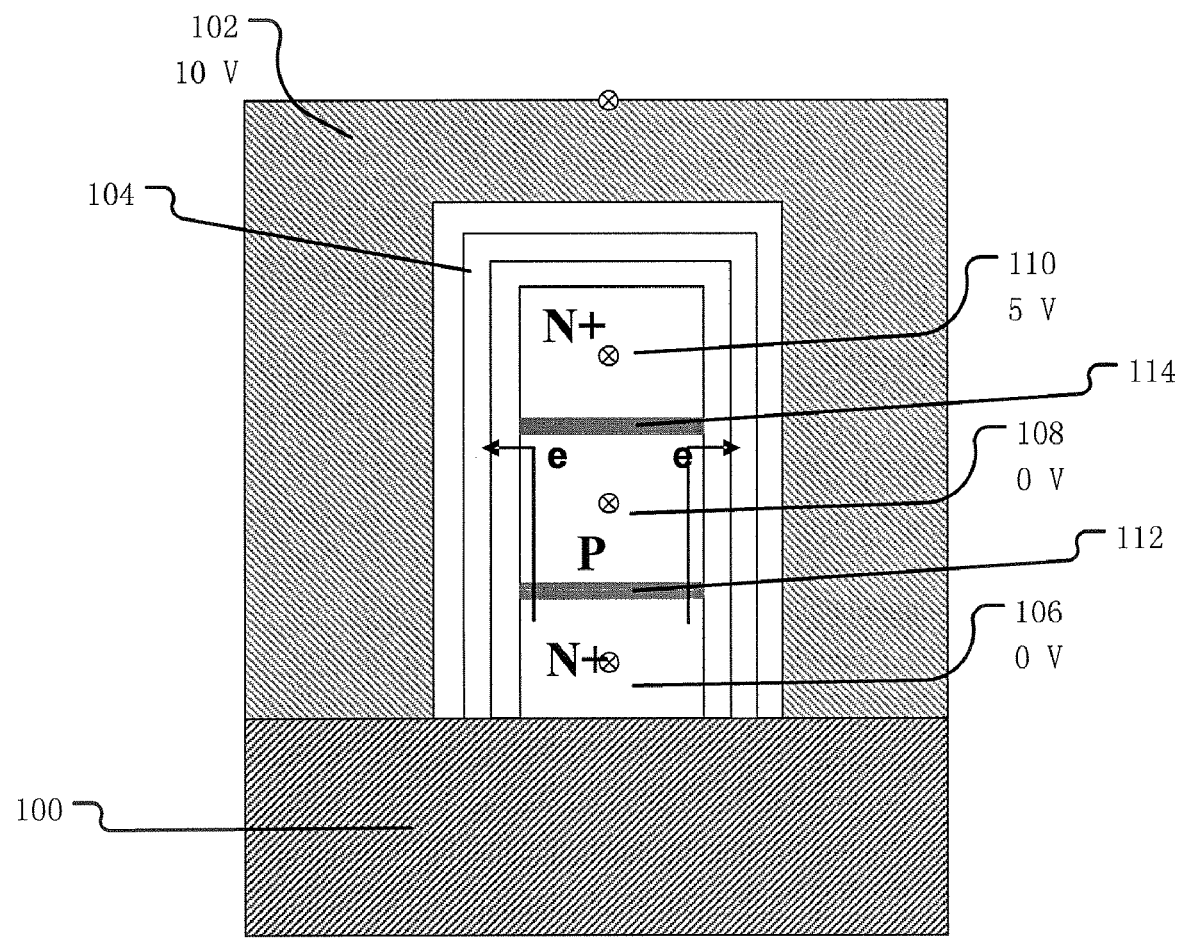
FIG. 9 is a simplified diagram of a vertical nonvolatile memory cell operation performing channel hot electron injection into a part of the charge storage structure by the upper n+/p junction.

FIG. 9 is a simplified diagram of a vertical nonvolatile memory cell operation performing channel hot electron injection into a part of the charge storage structure by the upper n+/p junction. The gate 102, node 110, node 108, and node 106 have respective voltages 10 V, 5 V, 0 V, and 0 V.

Figure 10:
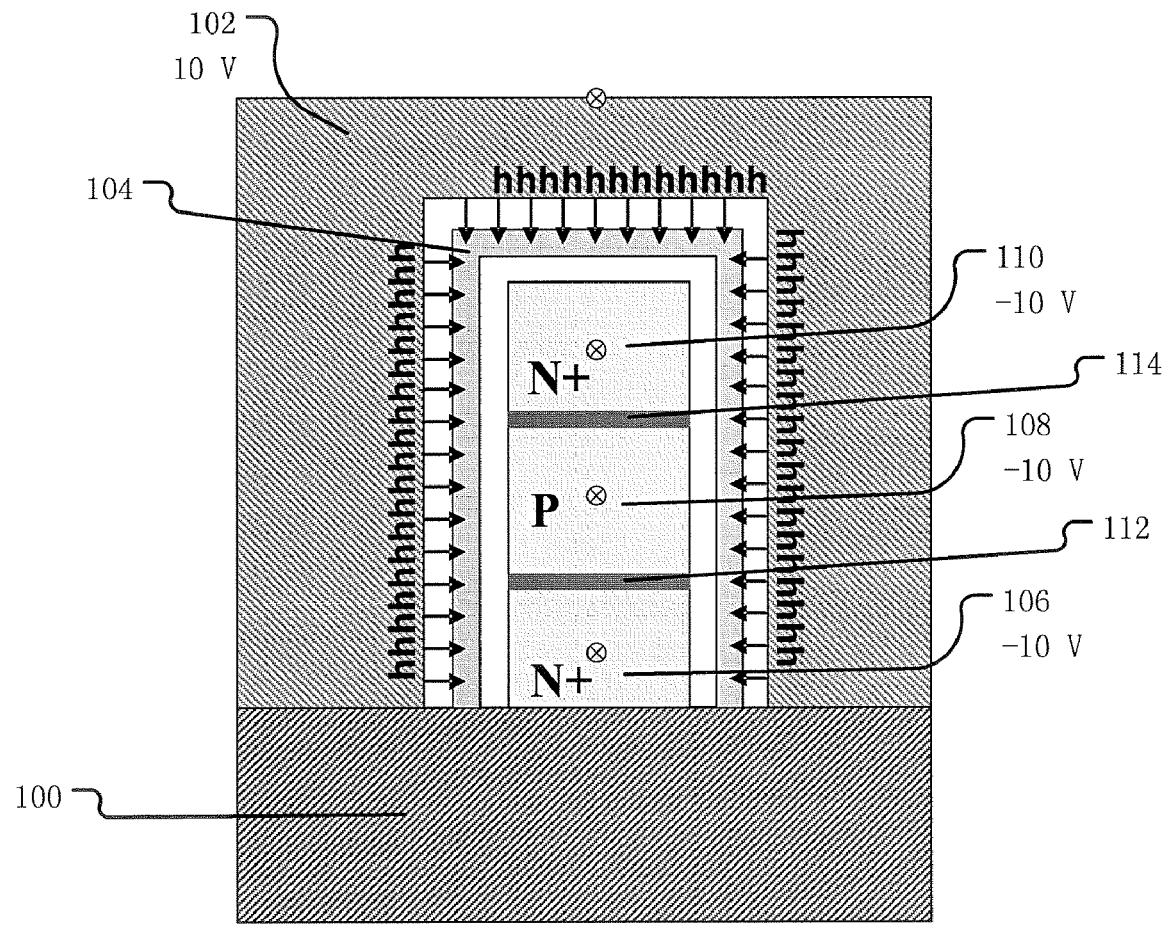
FIG. 10 is a simplified diagram of a vertical nonvolatile memory cell operation performing hole tunnel injection in a direction from the gate to the charge storage structure.

FIG. 10 is a simplified diagram of a vertical nonvolatile memory cell operation performing hole tunnel injection in a direction from the gate to the charge storage structure. The gate 102, node 110, node 108, and node 106 have respective voltages 10 V, −10 V, −10 V, and −10 V.

Figure 11:
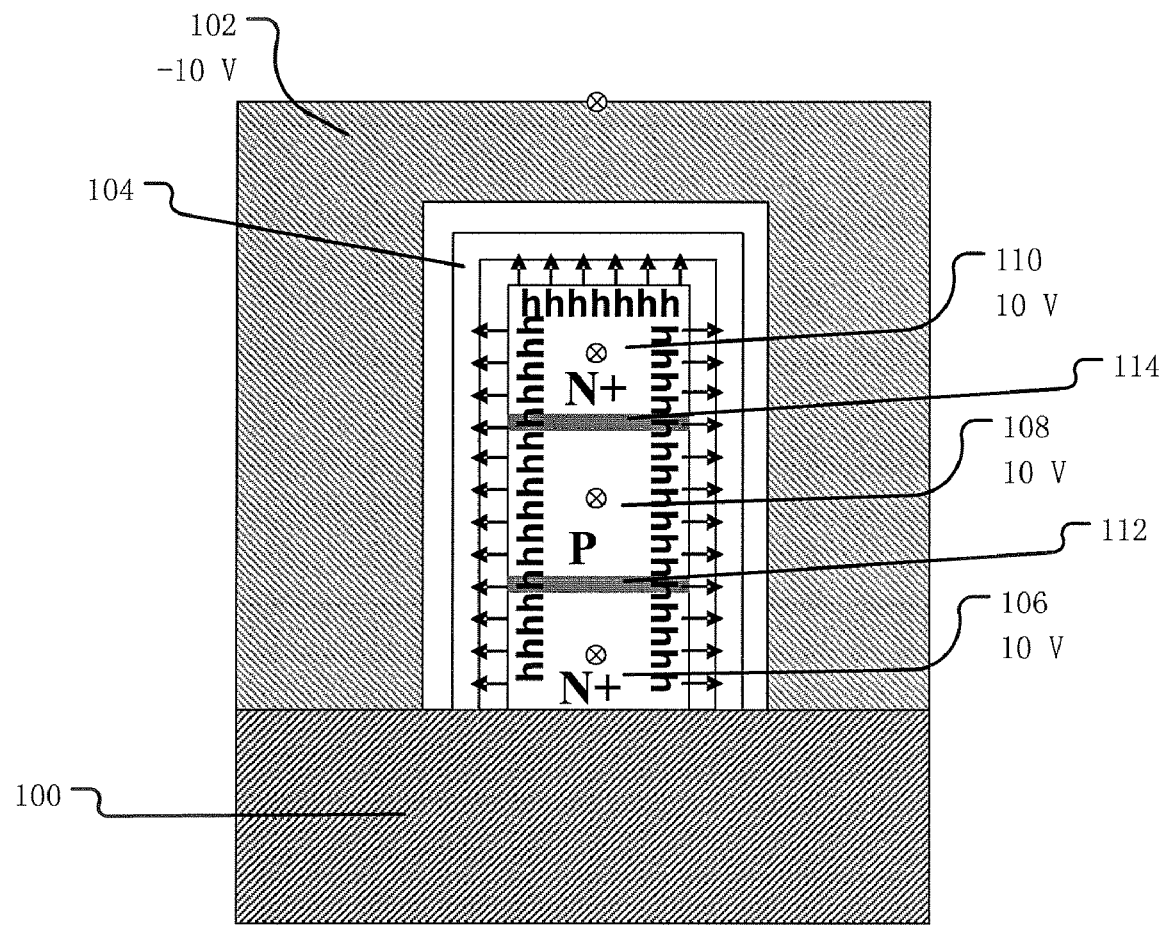
FIG. 11 is a simplified diagram of a vertical nonvolatile memory cell operation performing hole tunnel injection in a direction from the charge control structure to the charge storage structure.

FIG. 11 is a simplified diagram of a vertical nonvolatile memory cell operation performing hole tunnel injection in a direction from the charge control structure to the charge storage structure. The gate 102, node 110, node 108, and node 106 have respective voltages −10 V, 10 V, 10 V, and 10 V.

Figure 12:
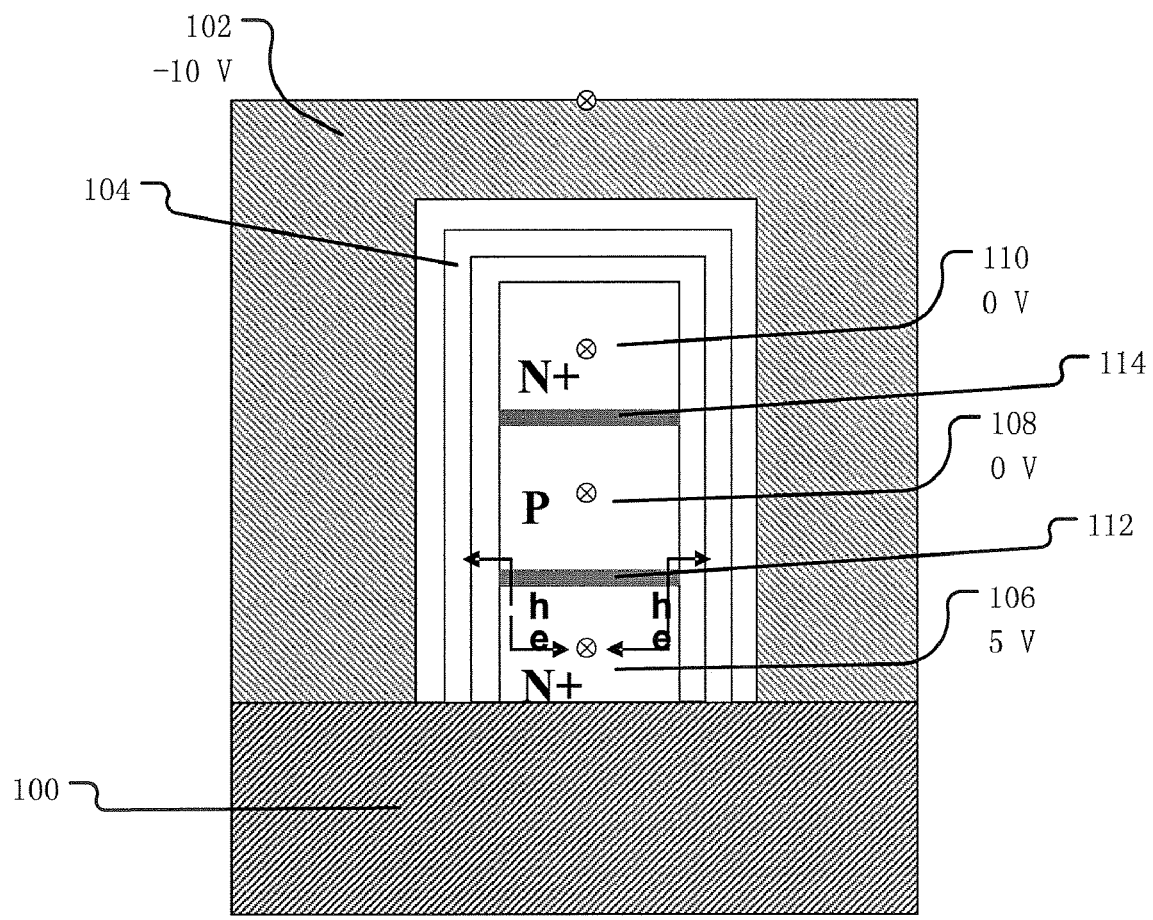
FIG. 12 is a simplified diagram of a vertical nonvolatile memory cell operation performing band-to-band hot hole injection into a part of the charge storage structure by the lower n+/p junction.

FIG. 12 is a simplified diagram of a vertical nonvolatile memory cell operation performing band-to-band hot hole injection into a part of the charge storage structure by the lower n+/p junction. The gate 102, node 110, node 108, and node 106 have respective voltages −10 V, 0 V, 0 V, and 5 V. From the resulting electron-hole pairs, as the holes move into the charge storage structure, the electrons move into node 106.

Figure 13:
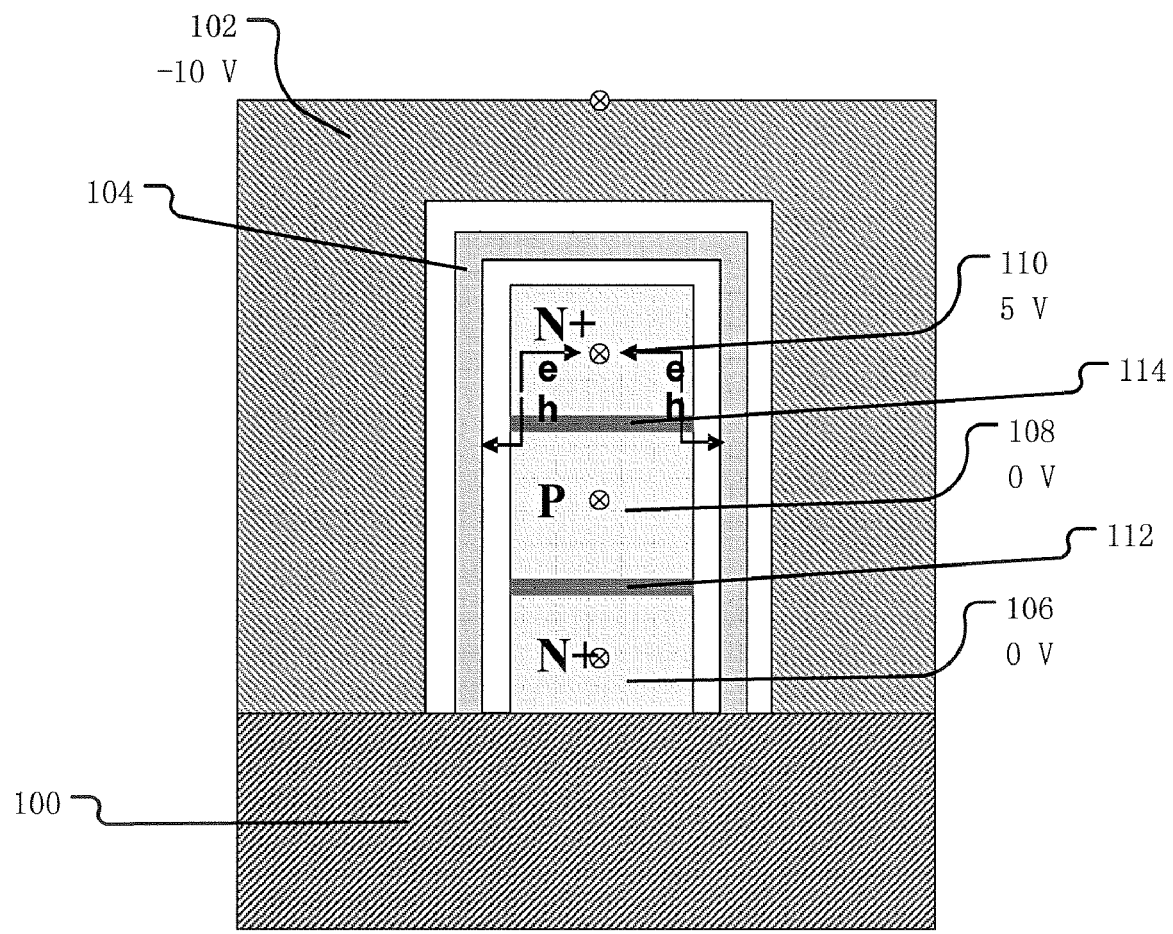
FIG. 13 is a simplified diagram of a vertical nonvolatile memory cell operation performing band-to-band hot hole injection into a part of the charge storage structure by the upper n+/p junction.

FIG. 13 is a simplified diagram of a vertical nonvolatile memory cell operation performing band-to-band hot hole injection into a part of the charge storage structure by the upper n+/p junction. The gate 102, node 110, node 108, and node 106 have respective voltages −10 V, 5 V, 0 V, and 0 V. From the resulting electron-hole pairs, as the holes move into the charge storage structure, the electrons move into node 110.

Figure 14:
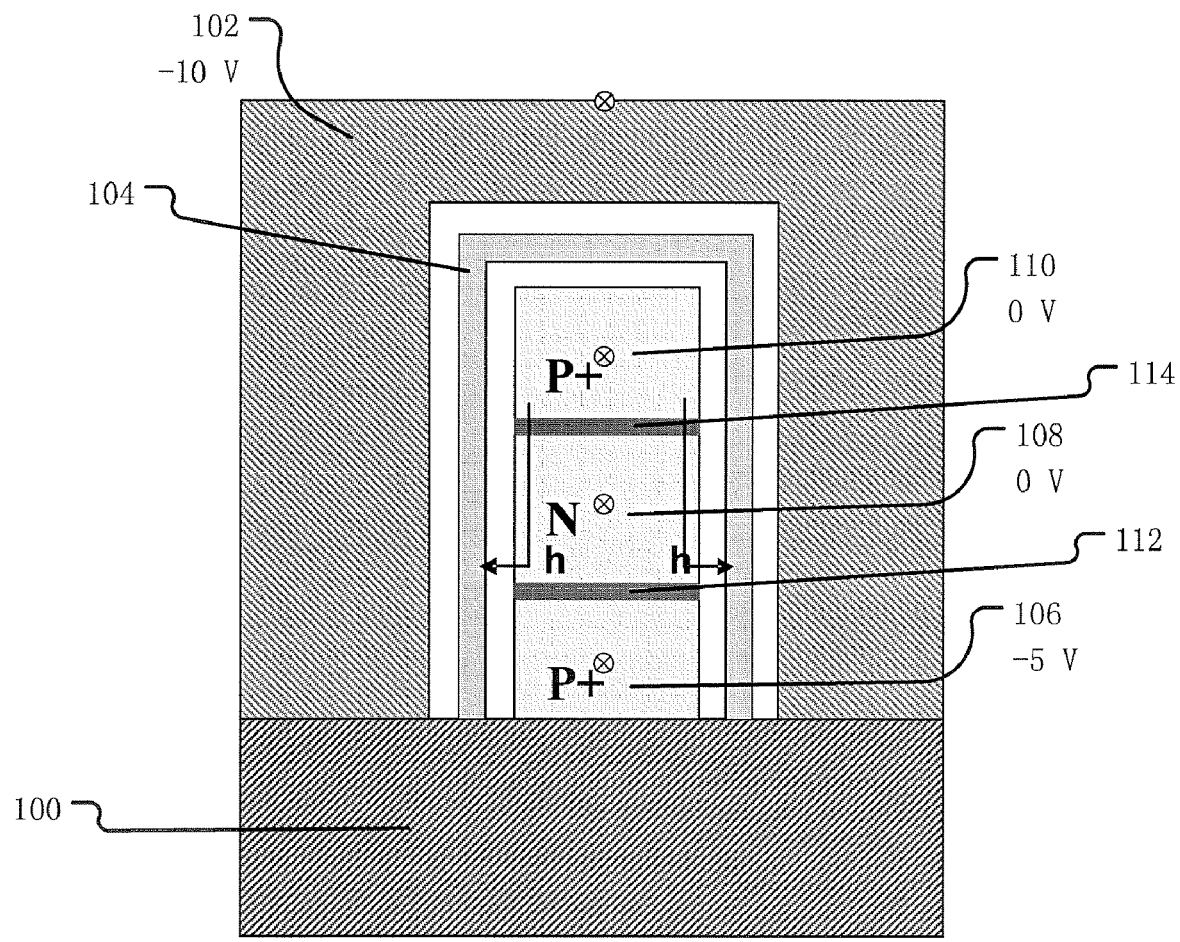
FIG. 14 is a simplified diagram of a vertical nonvolatile memory cell operation performing channel hot hole injection into a part of the charge storage structure by the lower p+/n junction.

FIG. 14 is a simplified diagram of a vertical nonvolatile memory cell operation performing channel hot hole injection into a part of the charge storage structure by the lower p+/n junction. The gate 102, node 110, node 108, and node 106 have respective voltages −10 V, 0 V, 0 V, and −5 V.

Figure 15:
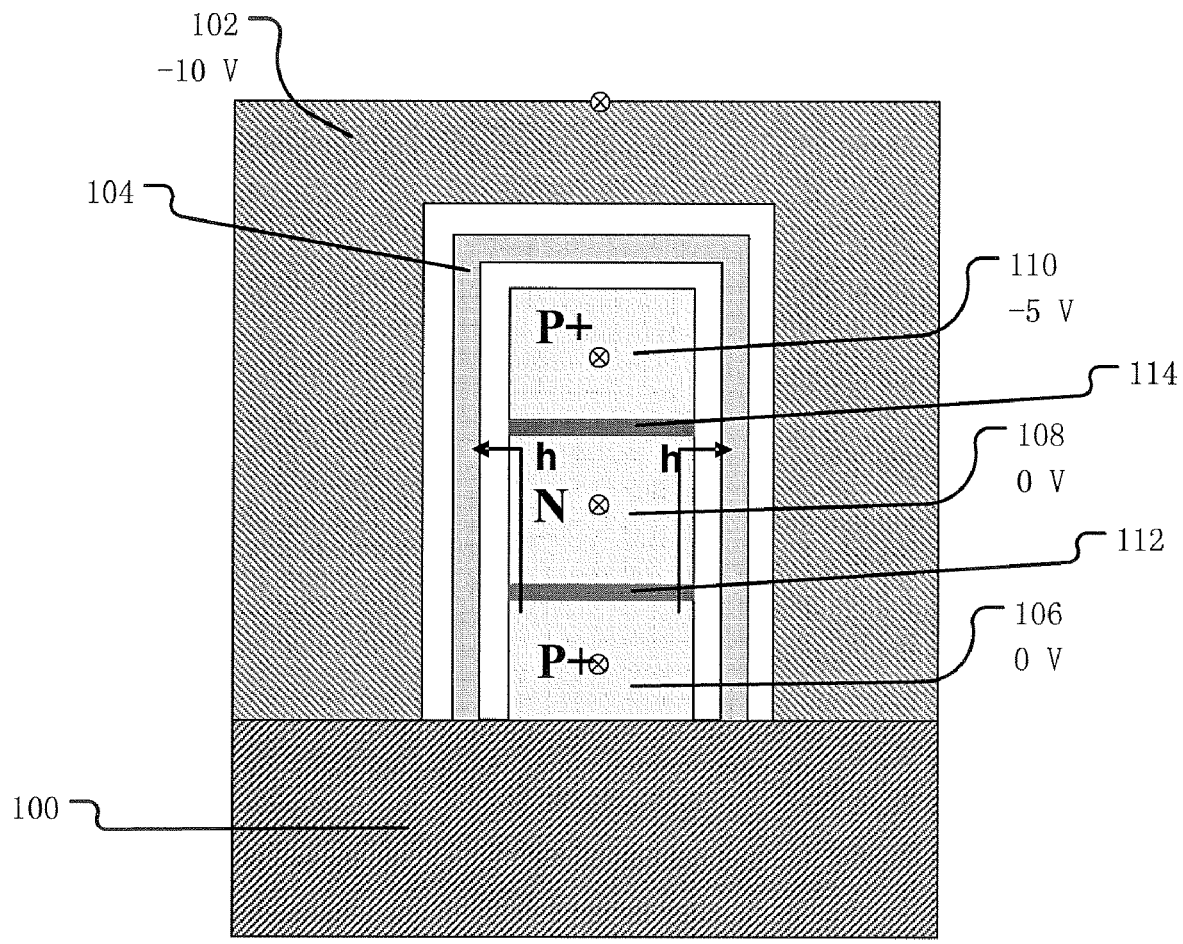
FIG. 15 is a simplified diagram of a vertical nonvolatile memory cell operation performing channel hot hole injection into a part of the charge storage structure by the upper p+/n junction.

FIG. 15 is a simplified diagram of a vertical nonvolatile memory cell operation performing channel hot hole injection into a part of the charge storage structure by the upper p+/n junction. The gate 102, node 110, node 108, and node 106 have respective voltages −10 V, −5 V, 0 V, and 0 V.

FIG. 16 is a simplified diagram of a vertical nonvolatile memory cell operation performing band-to-band sensing on the charge storage state corresponding to a part of the charge storage structure by the lower n+/p junction, where the charge storage state reflects relatively negative net charge. The gate 102, node 110, node 108, and node 106 have respective voltages −10 V, 0 V or floating, 0 V, and 2 V. From the resulting electron-hole pairs, as the holes move into node 108, the electrons move into node 106.

Band-to-band currents flowing through the charge control structure determine the charge storage state of the charge storage structure with great precision, due to combined vertical and lateral electrical fields. Larger vertical and lateral electrical fields give rise to larger band-to-band currents. A bias arrangement is applied to the various nodes, such that the energy bands bend sufficiently to cause band-to-band current in the charge control structure, while keeping the potential difference between the nodes sufficiently low enough such that programming or erasing does not occur.

In example bias arrangements, two nodes of the charge control structure are reverse biased. Additionally, the voltage of the gate structure causes the energy bands to bend sufficiently such that band-to-band tunneling occurs through the reverse biased part of the charge control structure. A high doping concentration in the one of the charge control structure nodes, with the resulting high charge density of the space charge region, and the accompanying short length of the space charge region over which the voltage changes, contributes to the sharp energy band bending. Electrons in the valence band on one side of the charge control structure junction tunnel through the forbidden gap to the conduction band on the other side of the charge control structure junction and drift down the potential hill, deeper into the n-type charge control structure node. Similarly, holes drift up the potential hill, away from the n-type charge control structure node, and toward the p-type charge control structure node.

The voltage of the gate controls the voltage of the portion of the charge control structure by the dielectric structure which is between the charge control structure and the charge storage structure. As the voltage of the gate becomes more negative, the voltage of the portion of the charge control structure by this dielectric structure becomes more negative, resulting in deeper band bending in the charge control structure. More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of Semiconductor Devices*, 1981).

The net negative or net positive charge stored on the charge storage structure further affects the degree of band bending. In accordance with Gauss's Law, when a negative voltage is applied to the gate structure relative to the charge control structure, a stronger electric field is experienced by portions of the charge control structure which are near portions of the charge storage structure having relatively higher net negative charge. Similarly, when a positive voltage is applied to the gate structure relative to the charge control structure, a stronger electric field is experienced by portions of the charge control structure which are near portions of the charge storage structure having relatively higher net positive charge.

The different bias arrangements for reading, and bias arrangements for programming and erasing, show a careful balance. For reading, the potential difference between the charge control structure nodes should not cause a substantial number of charge carriers to transit a dielectric to the charge storage structure and affect the charge storage state. In contrast, for programming and erasing, the potential difference between the charge control structure nodes can be sufficient to cause a substantial number of carriers to transit a dielectric and affect the charge storage state by band-to-band hot carrier injection.

Figure 17:
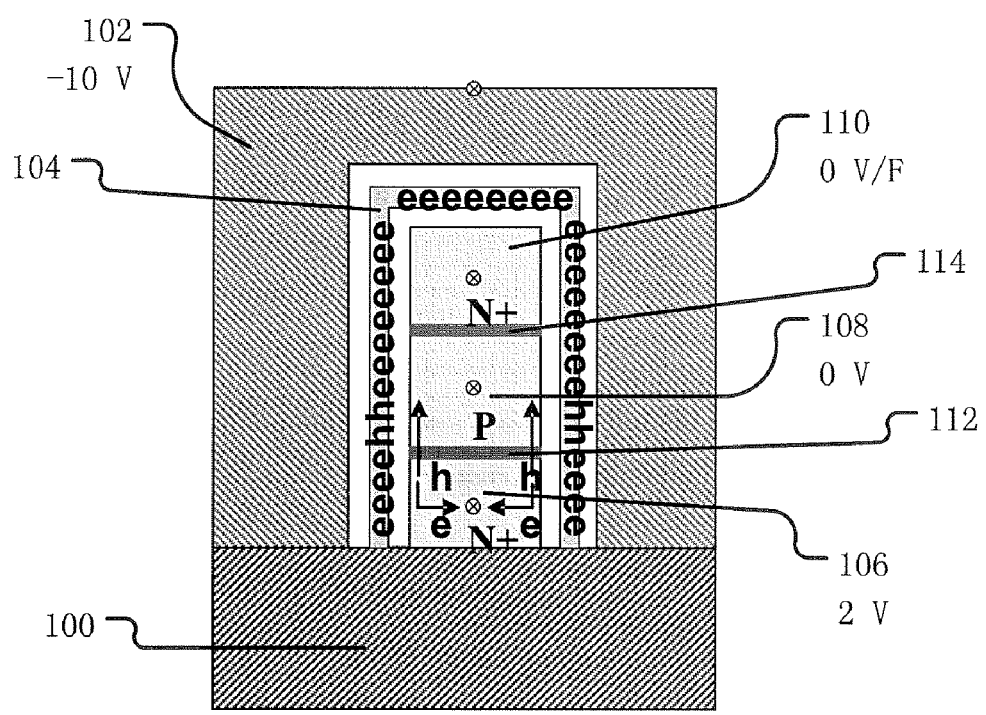
FIG. 17 is a simplified diagram of a vertical nonvolatile memory cell operation performing band-to-band sensing on the charge storage state corresponding to a part of the charge storage structure by the lower n+/p junction, where the charge storage state reflects relatively positive net charge.

FIG. 17 is a simplified diagram of a vertical nonvolatile memory cell operation performing band-to-band sensing on the charge storage state corresponding to a part of the charge storage structure by the lower n+/p junction, where the charge storage state reflects relatively positive net charge. The gate 102, node 110, node 108, and node 106 have respective voltages −10 V, 0 V or floating, 0 V, and 2 V. From the resulting electron-hole pairs, as the holes move into node 108, the electrons move into node 106.

Figure 18:
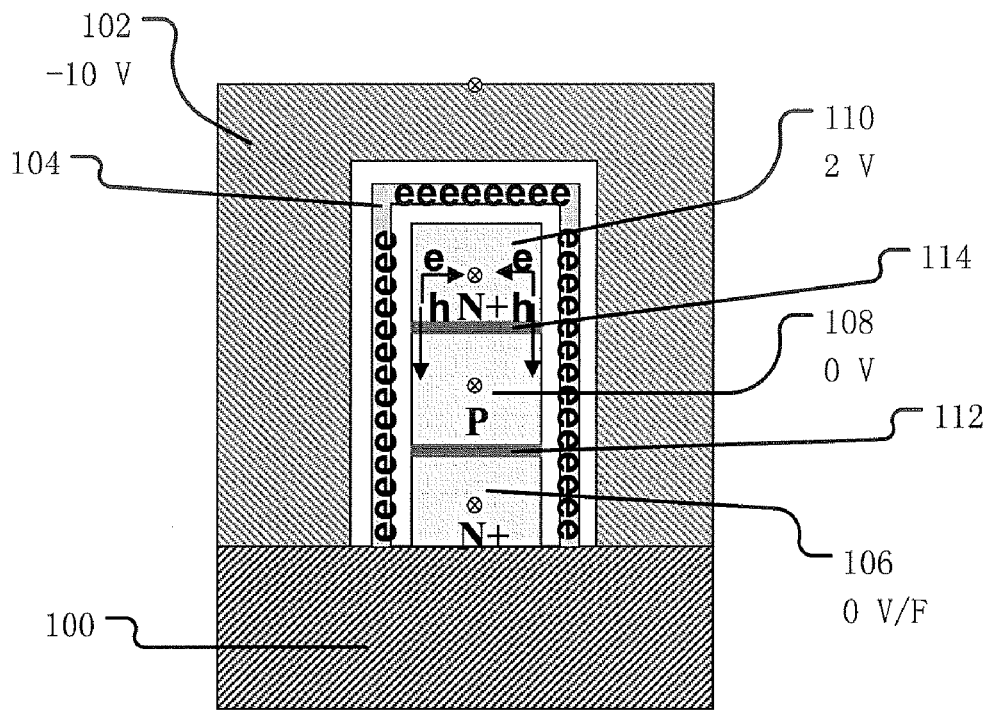
FIG. 18 is a simplified diagram of a vertical nonvolatile memory cell operation performing band-to-band sensing on the charge storage state corresponding to a part of the charge storage structure by the upper n+/p junction, where the charge storage state reflects relatively negative net charge.

FIG. 18 is a simplified diagram of a vertical nonvolatile memory cell operation performing band-to-band sensing on the charge storage state corresponding to a part of the charge storage structure by the upper n+/p junction, where the charge storage state reflects relatively negative net charge. The gate 102, node 110, node 108, and node 106 have respective voltages −10 V, 2 V, 0 V, and 0 V or floating. From the resulting electron-hole pairs, as the holes move into node 108, the electrons move into node 110.

Figure 19:
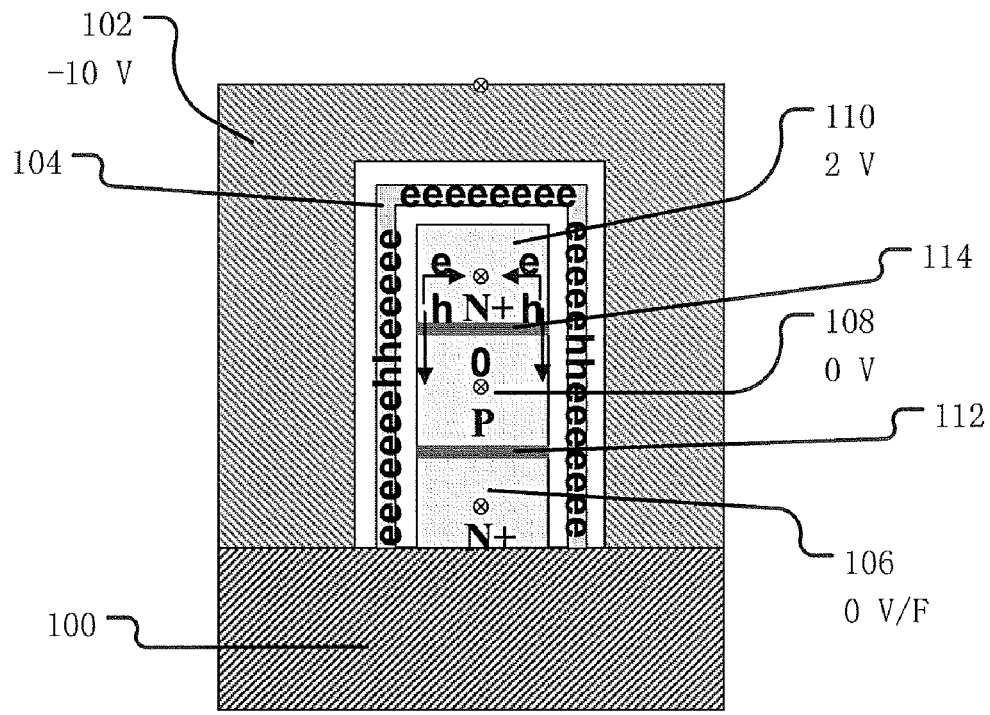
FIG. 19 is a simplified diagram of a vertical nonvolatile memory cell operation performing band-to-band sensing on the charge storage state corresponding to a part of the charge storage structure by the upper n+/p junction, where the charge storage state reflects relatively positive net charge.

FIG. 19 is a simplified diagram of a vertical nonvolatile memory cell operation performing band-to-band sensing on the charge storage state corresponding to a part of the charge storage structure by the upper n+/p junction, where the charge storage state reflects relatively positive net charge. The gate 102, node 110, node 108, and node 106 have respective voltages −10 V, 2 V, 0 V, and 0 V or floating. From the resulting electron-hole pairs, as the holes move into node 108, the electrons move into node 110.

In FIGS. 16-19, the top node 110 and bottom node 106 have relatively heavy n+ doping, and the middle node 108 has relatively light p doping. Accordingly, the sensing current is higher when the portion of the charge storage structure of interest with its corresponding charge storage state has a more negative net charge.

In another embodiment, the top node 110 and bottom node 106 have relatively heavy p+ doping, and the middle node 108 has relatively light n doping. Accordingly, the sensing current is higher when the portion of the charge storage structure of interest with its corresponding charge storage state has a more positive net charge.

Figure 20:
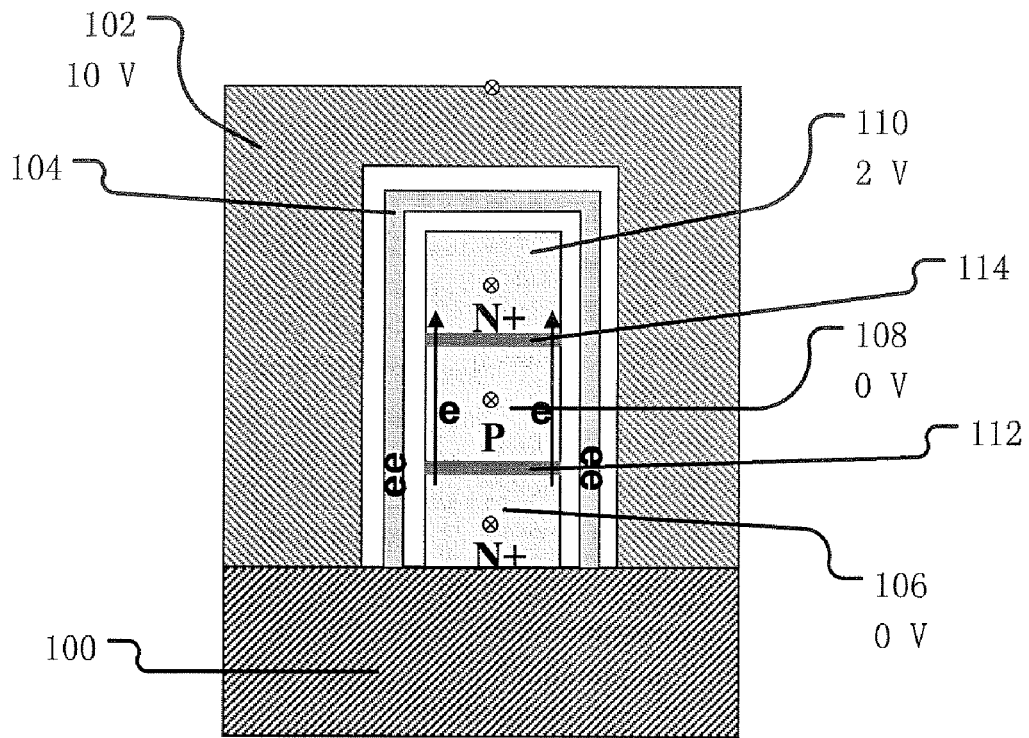
FIG. 20 is a simplified diagram of a vertical nonvolatile memory cell operation performing channel sensing on the charge storage state corresponding to a part of the charge storage structure by the lower n+/p junction, where the charge storage state reflects relatively negative net charge.

FIG. 20 is a simplified diagram of a vertical nonvolatile memory cell operation performing channel sensing on the charge storage state corresponding to a part of the charge storage structure by the lower n+/p junction, where the charge storage state reflects relatively negative net charge. The gate 102, node 110, node 108, and node 106 have respective voltages 10 V, 2 V, 0 V, and 0 V.

Figure 21:
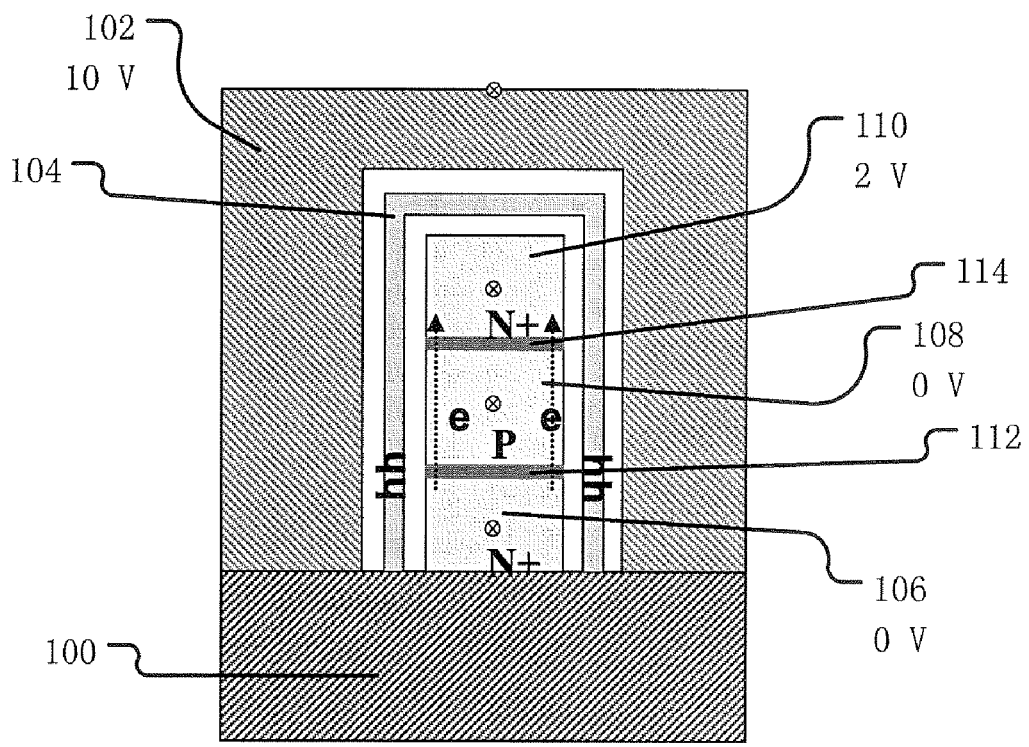
FIG. 21 is a simplified diagram of a vertical nonvolatile memory cell operation performing channel sensing on the charge storage state corresponding to a part of the charge storage structure by the lower n+/p junction, where the charge storage state reflects relatively positive net charge.

FIG. 21 is a simplified diagram of a vertical nonvolatile memory cell operation performing channel sensing on the charge storage state corresponding to a part of the charge storage structure by the lower n+/p junction, where the charge storage state reflects relatively positive net charge. The gate 102, node 110, node 108, and node 106 have respective voltages 10 V, 2 V, 0 V, and 0 V.

Figure 22:
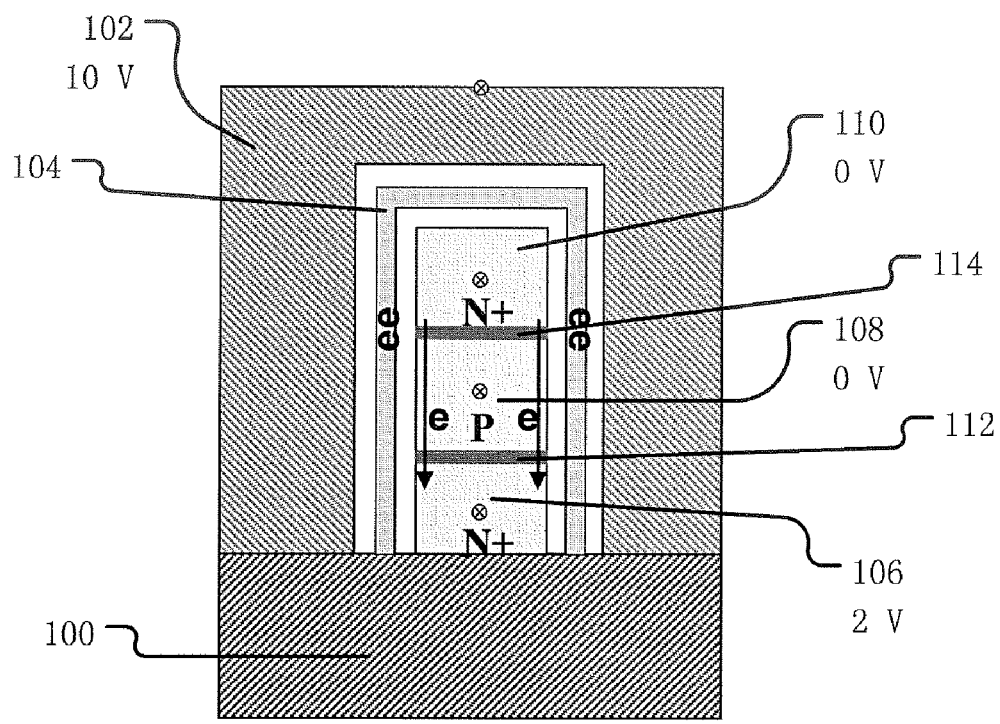
FIG. 22 is a simplified diagram of a vertical nonvolatile memory cell operation performing channel sensing on the charge storage state corresponding to a part of the charge storage structure by the upper n+/p junction, where the charge storage state reflects relatively negative net charge.

FIG. 22 is a simplified diagram of a vertical nonvolatile memory cell operation performing channel sensing on the charge storage state corresponding to a part of the charge storage structure by the upper n+/p junction, where the charge storage state reflects relatively negative net charge. The gate 102, node 110, node 108, and node 106 have respective voltages 10 V, 0 V, 0 V, and 2 V.

Figure 23:
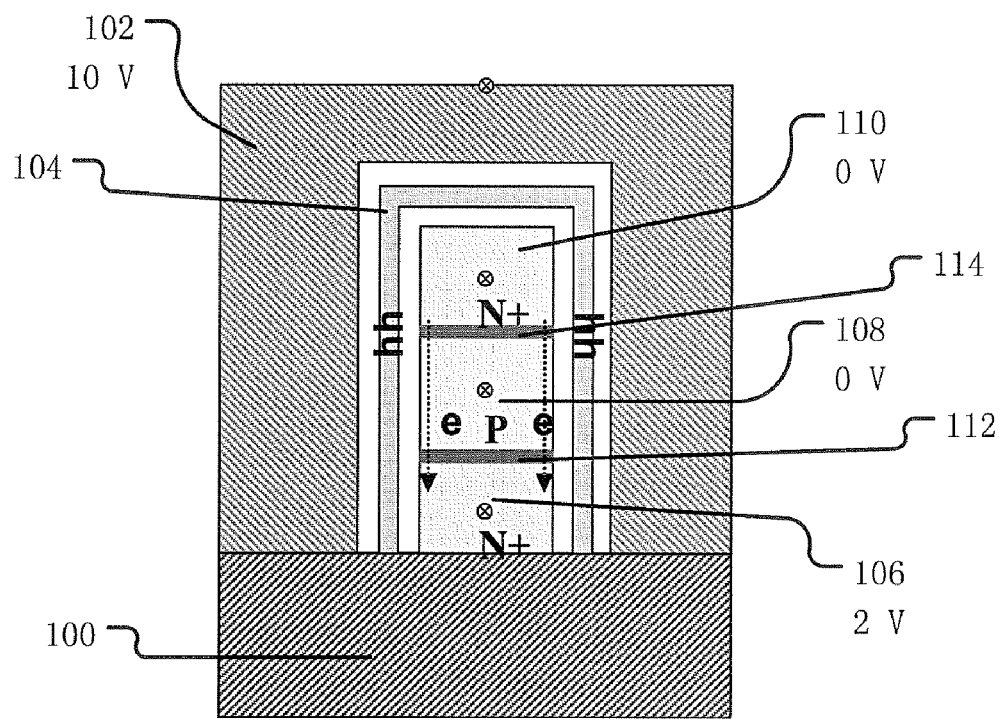
FIG. 23 is a simplified diagram of a vertical nonvolatile memory cell operation performing channel sensing on the charge storage state corresponding to a part of the charge storage structure by the upper n+/p junction, where the charge storage state reflects relatively positive net charge.

FIG. 23 is a simplified diagram of a vertical nonvolatile memory cell operation performing channel sensing on the charge storage state corresponding to a part of the charge storage structure by the upper n+/p junction, where the charge storage state reflects relatively positive net charge. The gate 102, node 110, node 108, and node 106 have respective voltages 10 V, 0 V, 0 V, and 2 V.

In FIGS. 20-23, the top node 110 and bottom node 106 have relatively heavy n+ doping, and the middle node 108 has relatively light p doping. Accordingly, the sensing current is higher when the portion of the charge storage structure of interest with its corresponding charge storage state has a more positive net charge.

In another embodiment, the top node 110 and bottom node 106 have relatively heavy p+ doping, and the middle node 108 has relatively light n doping. Accordingly, the sensing current is higher when the portion of the charge storage structure of interest with its corresponding charge storage state has a more negative net charge.

Figure 24:
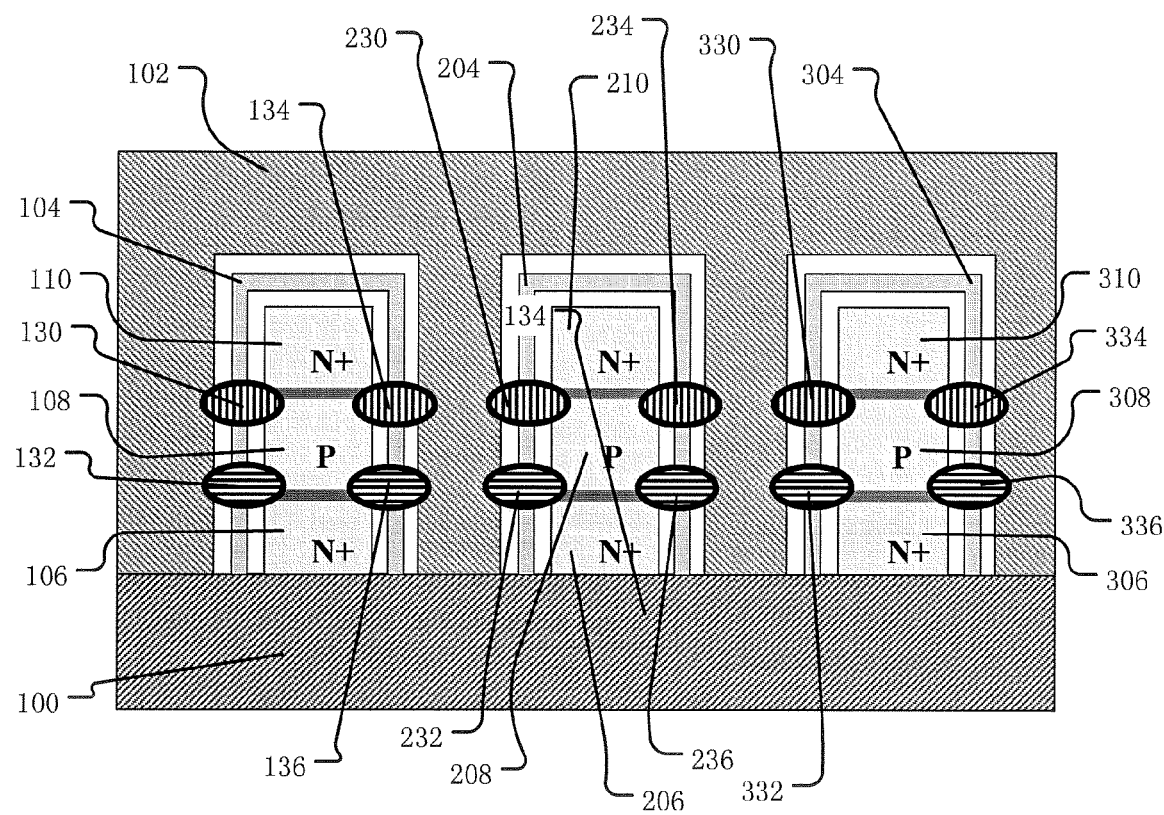
FIG. 24 is a simplified diagram of an array of vertical nonvolatile memory cells, indicating for each cell: the part of the charge storage structure by the upper n+/p junction corresponding to one charge storage state of the cell, and another part of the charge storage structure by the lower n+/p junction corresponding to another charge storage state of the cell.

FIG. 24 is a simplified diagram of an array of vertical nonvolatile memory cells, indicating for each cell: the part of the charge storage structure by the upper n+/p junction corresponding to one charge storage state of the cell, and another part of the charge storage structure by the lower n+/p junction corresponding to another charge storage state of the cell.

Gate voltage is applied by the gate 102. Three charge control structures are shown. The left charge control structure has nodes 110, 108, and 106. The left charge control structure causes charge to move to and from the parts of the left charge storage structure 104 that correspond to charge storage states, in particular parts 130 and 134 corresponding to the upper charge storage state, and parts 132 and 136 corresponding to the lower charge storage state. The center charge control structure has nodes 210, 208, and 206. The center charge control structure causes charge to move to and from the parts of the center charge storage structure 204 that correspond to charge storage states, in particular parts 230 and 234 corresponding to the upper charge storage state, and parts 232 and 236 corresponding to the lower charge storage state. The right charge control structure has nodes 310, 308, and 306. The left charge control structure causes charge to move to and from the parts of the right charge storage structure 304 that correspond to charge storage states, in particular parts 330 and 334 corresponding to the upper charge storage state, and parts 332 and 336 corresponding to the lower charge storage state.

Other embodiments have a p+/n/p+ charge control structure, or a charge control structure with a Schottky contact.

Figure 25:
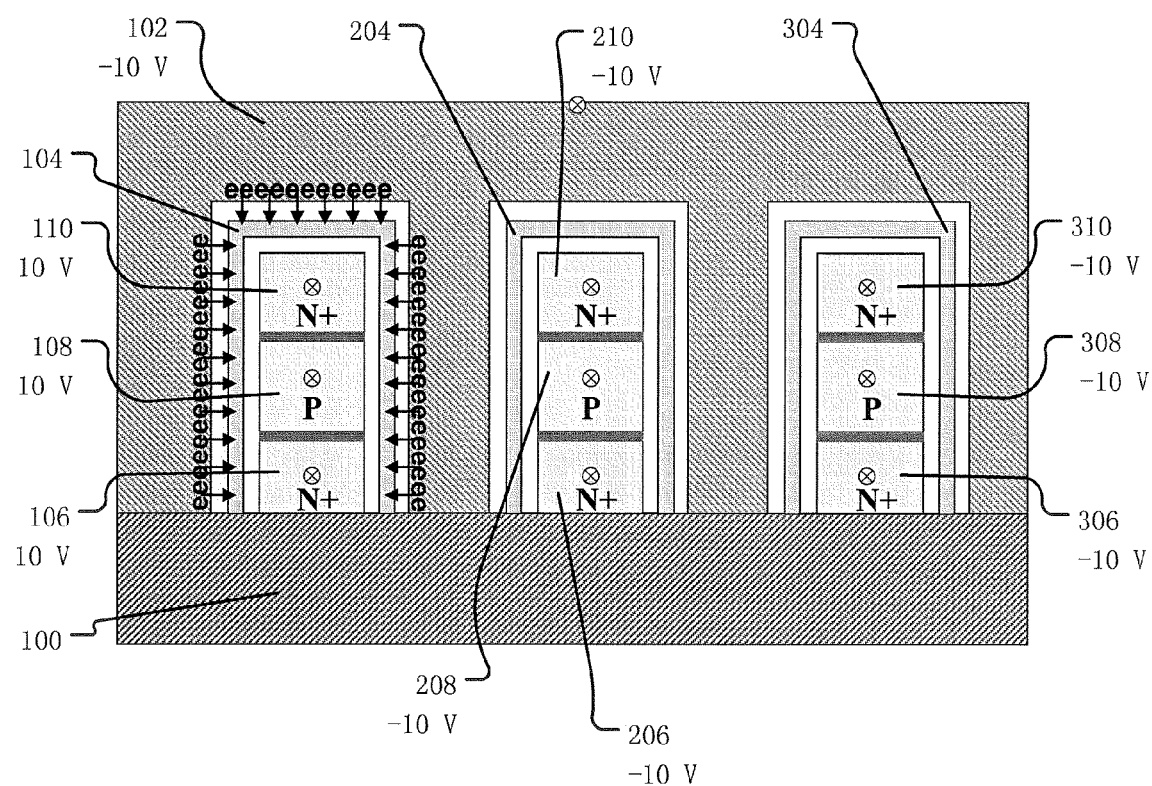
FIG. 25 is a simplified diagram of an array of vertical nonvolatile memory cells, performing electron tunnel injection in a direction from the gate to the charge storage structure, for a selected cell of the array.

FIG. 25 is a simplified diagram of an array of vertical nonvolatile memory cells, performing electron tunnel injection in a direction from the gate to the charge storage structure, for a selected cell of the array. The gate 102 has a voltage of −10 V. The left charge control structure has nodes 110, 108, and 106 with respective voltages of 10 V, 10 V, and 10 V. The center charge control structure has nodes 210, 208, and 206 with respective voltages of −10 V, −10 V, and −10 V. The right charge control structure has nodes 310, 308, and 306 with respective voltages of −10 V, −10 V, and −10 V.

Other operations include electron tunnel injection in a direction from the charge control structure to the charge storage structure, hole tunnel injection from the charge control structure to the charge storage structure, and hole tunnel injection from the gate to the charge storage structure, for a selected cell of the array.

Figure 26:
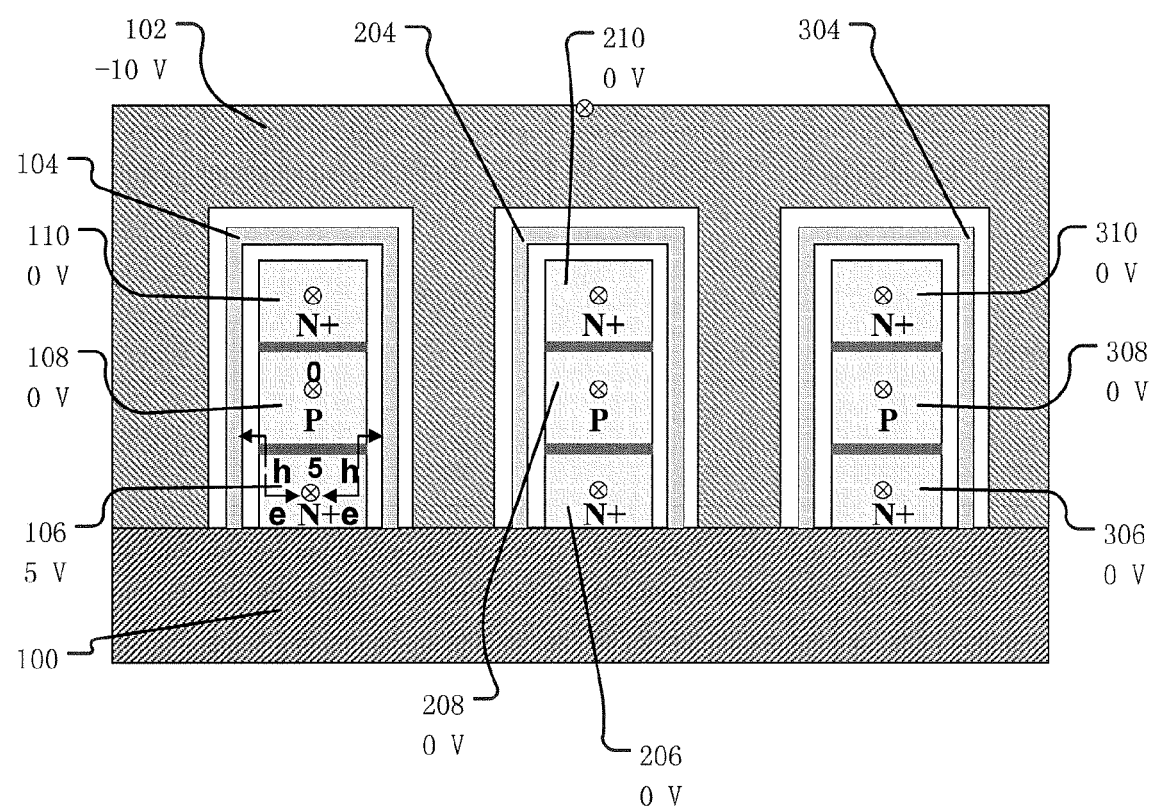
FIG. 26 is a simplified diagram of an array of vertical nonvolatile memory cells, performing band-to-band hot hole injection into a part of the charge storage structure by the lower n+/p junction, for a selected cell of the array.

FIG. 26 is a simplified diagram of an array of vertical nonvolatile memory cells, performing band-to-band hot hole injection into a part of the charge storage structure by the lower n+/p junction, for a selected cell of the array. The gate 102 has a voltage of −10 V. The left charge control structure has nodes 110, 108, and 106 with respective voltages of 0 V, 0 V, and 5 V. The center charge control structure has nodes 210, 208, and 206 with respective voltages of 0 V, 0 V, and 0 V. The right charge control structure has nodes 310, 308, and 306 with respective voltages of 0 V, 0 V, and 0 V. From the resulting electron-hole pairs, as the holes move into the charge storage structure, the electrons move into node 106.

Other operations include band-to-band hot hole injection into a part of the charge storage structure by the upper n+/p junction, band-to-band hot electron injection into a part of the charge storage structure by an upper p+/n junction in a p+/n/p+ channel control structure, and band-to-band hot electron injection into a part of the charge storage structure by a lower p+/n junction in a p+/n/p+ channel control structure, for a selected cell of the array.

Figure 27:
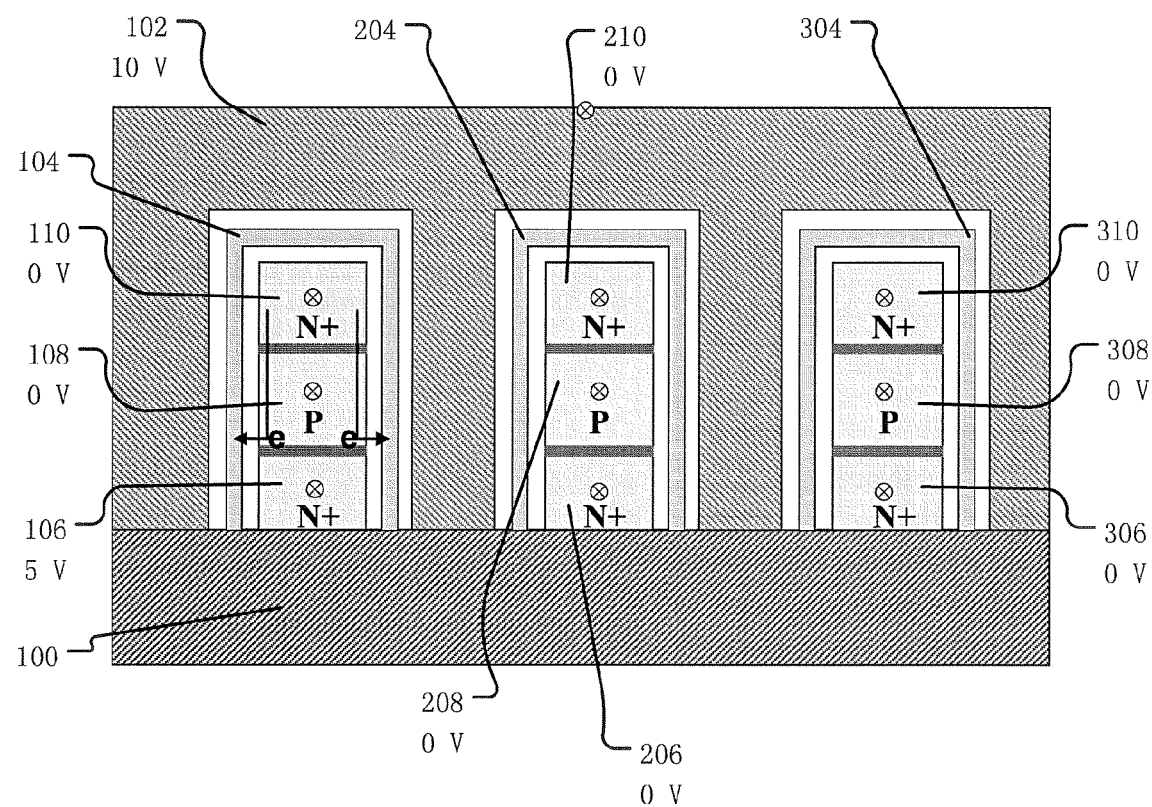
FIG. 27 is a simplified diagram of an array of vertical nonvolatile memory cells, performing channel hot electron injection into a part of the charge storage structure by the lower n+/p junction, for a selected cell of the array.

FIG. 27 is a simplified diagram of an array of vertical nonvolatile memory cells, performing channel hot electron injection into a part of the charge storage structure by the lower n+/p junction, for a selected cell of the array. The gate 102 has a voltage of 10 V. The left charge control structure has nodes 110, 108, and 106 with respective voltages of 0 V, 0 V, and 5 V. The center charge control structure has nodes 210, 208, and 206 with respective voltages of 0 V, 0 V, and 0 V. The right charge control structure has nodes 310, 308, and 306 with respective voltages of 0 V, 0 V, and 0 V.

Other operations include channel hot electron injection into a part of the charge storage structure by the upper n+/p junction, channel hot hole injection into a part of the charge storage structure by a lower p+/junction in a p+/n/p+ channel control structure, and channel hot hole injection into a part of the charge storage structure by an upper p+/junction in a p+/n/p+ channel control structure, for a selected cell of the array.

Figure 28:
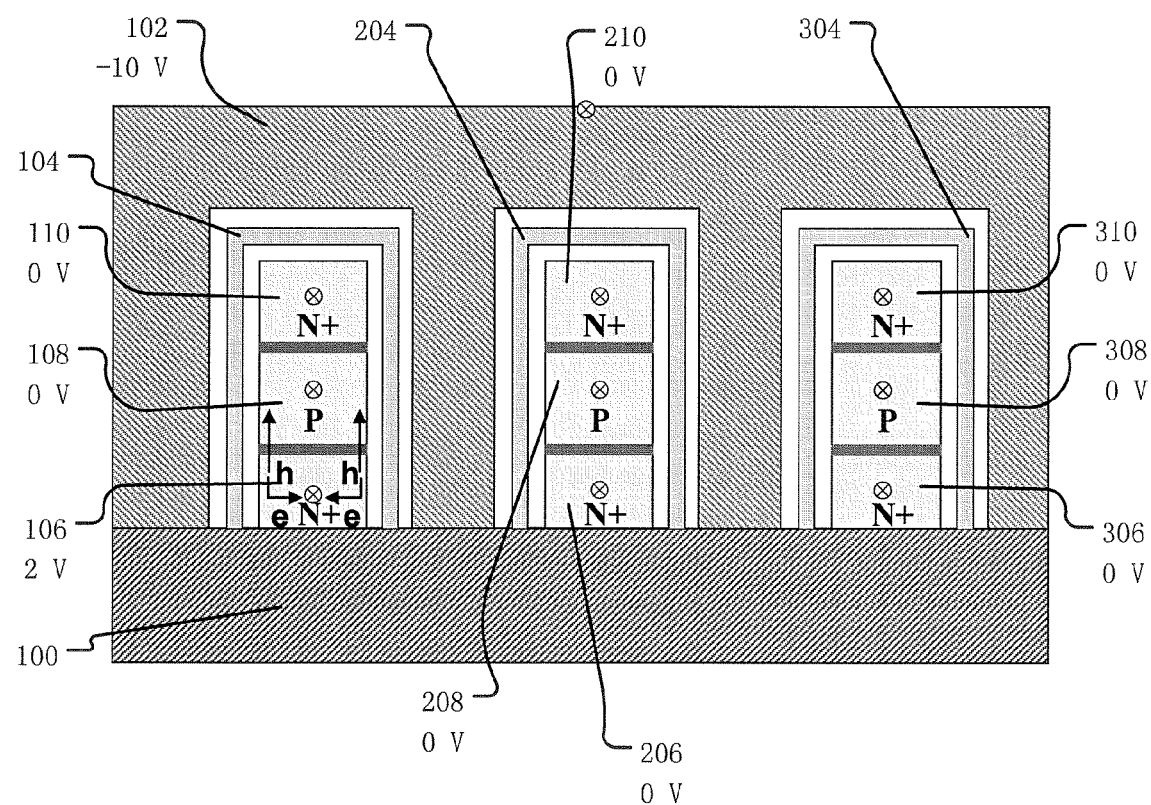
FIG. 28 is a simplified diagram of an array of vertical nonvolatile memory cells, performing band-to-band sensing on the charge storage state corresponding to a part of the charge storage structure by the lower n+/p junction, for a selected cell of the array.

FIG. 28 is a simplified diagram of an array of vertical nonvolatile memory cells, performing band-to-band sensing on the charge storage state corresponding to a part of the charge storage structure by the lower n+/p junction, for a selected cell of the array. The gate 102 has a voltage of −10 V. The left charge control structure has nodes 110, 108, and 106 with respective voltages of 0 V, 0 V, and 2 V. The center charge control structure has nodes 210, 208, and 206 with respective voltages of 0 V, 0 V, and 0 V. The right charge control structure has nodes 310, 308, and 306 with respective voltages of 0 V, 0 V, and 0 V. From the resulting electron-hole pairs, as the holes move into node 108, the electrons move into node 106.

Other operations include band-to-band sensing on the charge storage state corresponding to a part of the charge storage structure by the upper n+/p junction, band-to-band sensing on the charge storage state corresponding to a part of the charge storage structure by an upper p+/n junction in a p+/n/p+ channel control structure, and band-to-band sensing on the charge storage state corresponding to a part of the charge storage structure by a lower p+/n junction in a p+/n/p+ channel control structure, for a selected cell of the array.

Figure 29:
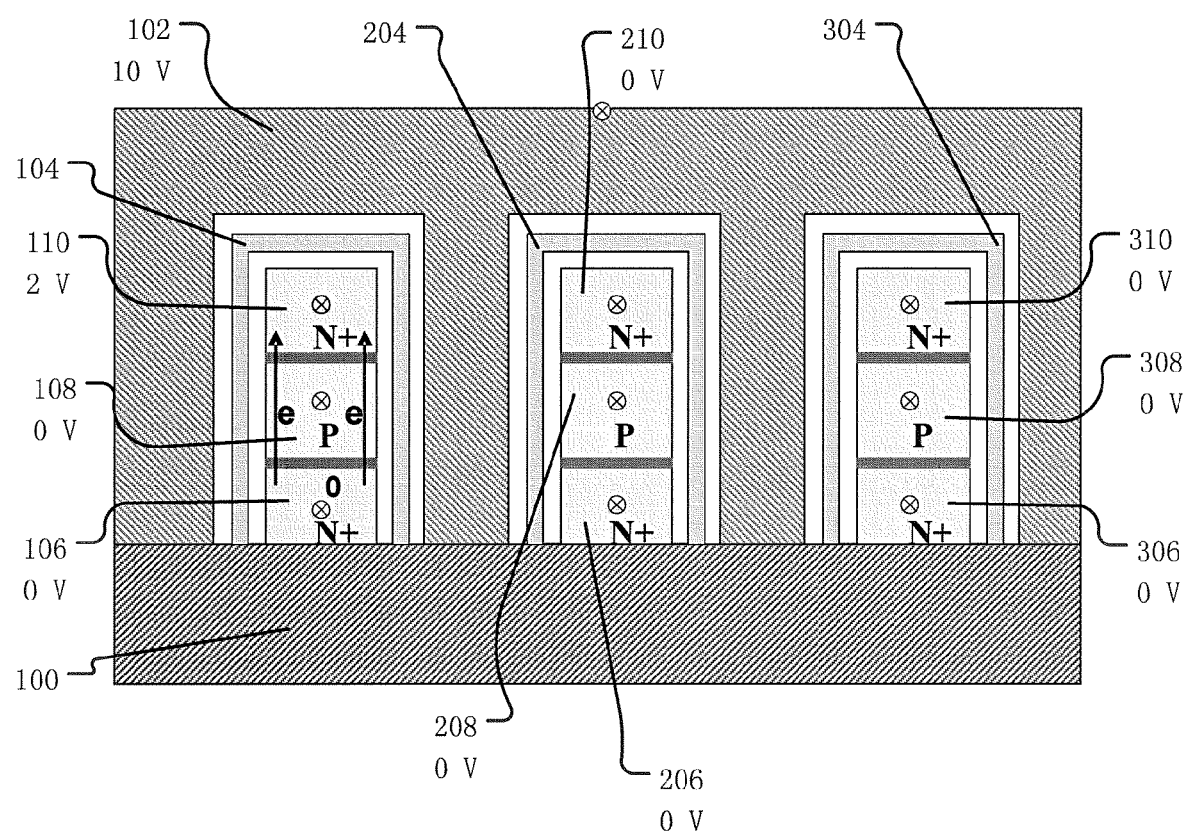
FIG. 29 is a simplified diagram of an array of vertical nonvolatile memory cells, performing channel sensing on the charge storage state corresponding to a part of the charge storage structure by the lower n+/p junction, for a selected cell of the array.

FIG. 29 is a simplified diagram of an array of vertical nonvolatile memory cells, performing channel sensing on the charge storage state corresponding to a part of the charge storage structure by the lower n+/p junction, for a selected cell of the array. The gate 102 has a voltage of 10 V. The left charge control structure has nodes 110, 108, and 106 with respective voltages of 2 V, 0 V, and 0 V. The center charge control structure has nodes 210, 208, and 206 with respective voltages of 0 V, 0 V, and 0 V. The right charge control structure has nodes 310, 308, and 306 with respective voltages of 0 V, 0 V, and 0 V.

Other operations include channel sensing on the charge storage state corresponding to a part of the charge storage structure by the upper n+/p junction, channel sensing on the charge storage state corresponding to a part of the charge storage structure by a upper p+/n junction in a p+/n/p+ channel control structure, channel sensing on the charge storage state corresponding to a part of the charge storage structure by a lower p+/n junction in a p+/n/p+ channel control structure, for a selected cell of the array.

Figure 30:
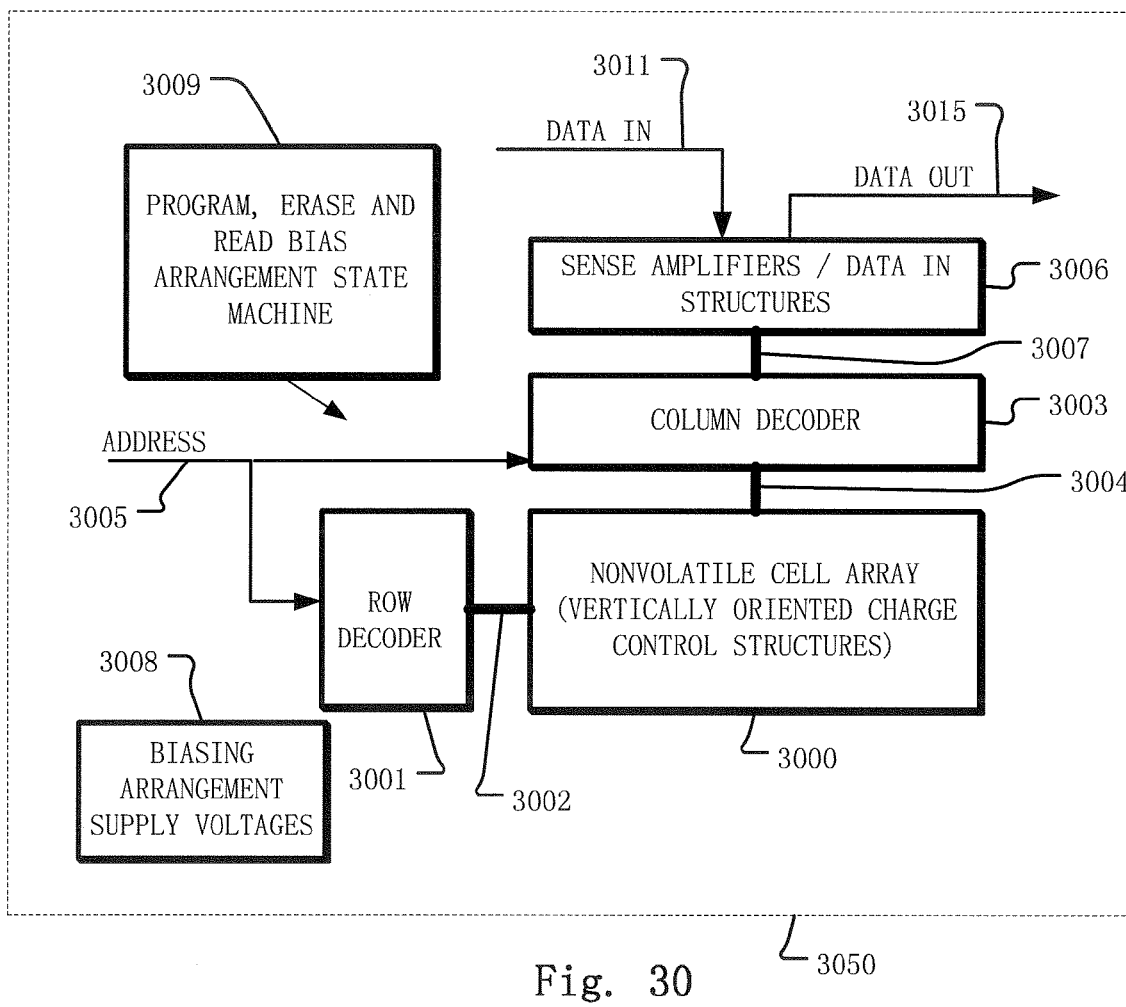
FIG. 30 is a simplified diagram of an integrated circuit with an array of vertical nonvolatile memory cells and control circuitry.

FIG. 30 is a simplified diagram of an integrated circuit with an array of vertical nonvolatile memory cells and control circuitry. The integrated circuit 3050 includes a memory array 3000 implemented using vertical nonvolatile memory cells, on a semiconductor substrate. The vertical memory cells of array 3000 may be individual cells, interconnected in arrays, or interconnected in multiple arrays. A row decoder 3001 is coupled to a plurality of word lines 3002 arranged along rows in the memory array 3000. A column decoder 3003 is coupled to a plurality of bit lines 3004 arranged along columns in the memory array 3000. Addresses are supplied on bus 3005 to column decoder 3003 and row decoder 3001. Sense amplifiers and data-in structures in block 3006 are coupled to the column decoder 3003 via data bus 3007. Data is supplied via the data-in line 3011 from input/output ports on the integrated circuit 3050, or from other data sources internal or external to the integrated circuit 3050, to the data-in structures in block 3006. Data is supplied via the data-out line 3015 from the sense amplifiers in block 3006 to input/output ports on the integrated circuit 3050, or to other data destinations internal or external to the integrated circuit 3050. A bias arrangement state machine 3009 controls the application of bias arrangement supply voltages 3008, such as for the erase verify and program verify voltages, and the arrangements for programming, erasing, and reading the vertical memory cells, such as with the band-to-band currents. The integrated circuit of FIG. 30 has embodiments with and without diffusion barrier junctions.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit of a nonvolatile memory device storing data, comprising:
one or more charge storage structures having a first location storing a first charge storage state and a second location storing a second charge storage state, the first charge storage state and the second charge storage state representing the data such that the first charge storage state and the second charge storage state each represent at least one bit of the data;
one or more storage dielectric structures at least partly between the first location of the one or more charge storage structures and a charge control structure, at least partly between the second location of the one or more charge storage structures and the charge control structure, at least partly between the first location of the one or more charge storage structures and a source of gate voltage, and at least partly between the second location of the one or more charge storage structure and the source of gate voltage;
the charge control structure having:
a first node having a first charge type;
a second node having a second charge type opposite to the first charge type;
a third node having the first charge type;
a first junction separating the first node and the second node, the first junction adjacent to a part of the one or more storage dielectric structures at least partly between the first location of the one or more charge storage structures and the charge control structure;
a second junction separating the second node and the third node, the second junction adjacent to a part of the one or more storage dielectric structures at least partly between the second location of the one or more charge storage structures and the charge control structure,
wherein the charge control structure is vertically oriented with respect to a substrate of the integrated circuit, such that in a cross-section of the nonvolatile memory device, the second node and the third node are further from the substrate than the first node, and the third node is further from the substrate than the second node.

2. The integrated circuit of claim 1, wherein the first junction includes a first diffusion barrier junction, and the second junction includes a second diffusion barrier junction.

3. The integrated circuit of claim 1, wherein the first junction includes a first diffusion barrier junction, and the second junction includes a second diffusion barrier junction, and
wherein at least part of the first diffusion barrier junction by the one or more storage dielectric structures is no more than about 20 Angstroms thick, and at least part of the second diffusion barrier junction by the one or more storage dielectric structures is no more than about 20 Angstroms thick.

4. The integrated circuit of claim 1, wherein at least one of the first junction and the second junction includes a Schottky junction.

5. The integrated circuit of claim 1, further comprising:
wherein the first charge type of the first node and the third node is n-type, and the second charge type of the second node is p-type.

6. The integrated circuit of claim 1, further comprising:
wherein the first charge type of the first node and the third node is p-type, and the second charge type of the second node is n-type.

7. The integrated circuit of claim 1, further comprising:
wherein the nonvolatile memory device has a cross-section in which the nonvolatile memory device is separated from neighboring nonvolatile memory devices of the integrated circuit by the source of gate voltage.

8. The integrated circuit of claim 1, further comprising:
logic coupled to the charge control structure, said logic performing:
applying a bias arrangement to control at least one of the first charge storage state and the second charge storage state, by causing electrons to tunnel from the source of gate voltage to said one or more charge storage structures.

9. The integrated circuit of claim 1, further comprising:
logic coupled to the charge control structure, said logic performing:
applying a bias arrangement to control at least one of the first charge storage state and the second charge storage state, by causing electrons to tunnel from the charge control structure to said one or more charge storage structures.

10. The integrated circuit of claim 1, further comprising:
logic coupled to the charge control structure, said logic performing:
applying a bias arrangement to control at least one of the first charge storage state and the second charge storage state, by causing holes to tunnel from the source of gate voltage to said one or more charge storage structures.

11. The integrated circuit of claim 1, further comprising:
logic coupled to the charge control structure, said logic performing:
applying a bias arrangement to control at least one of the first charge storage state and the second charge storage state, by causing holes to tunnel from the charge control structure to said one or more charge storage structures.

12. The integrated circuit of claim 1, further comprising:
logic coupled to the charge control structure, said logic performing:
applying a bias arrangement to control a selected one of the first charge storage state and the second charge storage state, by causing band-to-band tunneling of hot holes from the charge control structure to said one or more charge storage structures.

13. The integrated circuit of claim 1, further comprising:
logic coupled to the charge control structure, said logic performing:
applying a bias arrangement to control a selected one of the first charge storage state and the second charge storage state, by causing band-to-band tunneling of hot electrons from the charge control structure to said one or more charge storage structures.

14. The integrated circuit of claim 1, further comprising:
logic coupled to the charge control structure, said logic performing:
applying a bias arrangement to control a selected one of the first charge storage state and the second charge storage state, by causing channel hot electron movement from the charge control structure to said one or more charge storage structures.

15. The integrated circuit of claim 1, further comprising:
logic coupled to the charge control structure, said logic performing:
applying a bias arrangement to control a selected one of the first charge storage state and the second charge storage state, by causing channel hot hole movement from the charge control structure to said one or more charge storage structures.

16. The integrated circuit of claim 1, further comprising:
logic coupled to the charge control structure, said logic performing:
applying a bias arrangement to determine selectively one of the first charge storage state and the second charge storage state and to measure band-to-band current flowing through the charge control structure to selectively determine one of the first charge storage state and the second charge storage state.

17. The integrated circuit of claim 1, further comprising:
logic coupled to the charge control structure, said logic performing:
applying a bias arrangement to determine selectively one of the first charge storage state and the second charge storage state and to measure channel current flowing through the charge control structure to determine selectively one of the first charge storage state and the second charge storage state.

18. The integrated circuit of claim 1, wherein said one or more charge storage structures includes floating gate material.

19. The integrated circuit of claim 1, wherein said one or more charge storage structures includes charge trapping material.

20. The integrated circuit of claim 1, wherein said one or more charge storage structures includes nanocrystal material.

21. The integrated circuit of claim 1, wherein each charge storage state stores one bit.

22. The integrated circuit of claim 1, wherein each charge storage state stores multiple bits.

23. The integrated circuit of claim 1, wherein the charge control structure includes at least one of Si, polysilicon, Ge, and SiGe.

24. The integrated circuit of claim 1, wherein the first junction and the second junction are at least one of single crystal and polycrystalline.

25. An integrated circuit of an array of nonvolatile memory devices storing data, comprising:
an array of nonvolatile memory storage devices, each including
one or more charge storage structures having a first location storing a first charge storage state and a second location storing a second charge storage state, the first charge storage state and the second charge storage state representing the data such that the first charge storage state and the second charge storage state each represent at least one bit of the data;
one or more storage dielectric structures at least partly between the first location of the one or more charge storage structures and a charge control structure, at least partly between the second location of the one or more charge storage structures and the charge control structure, at least partly between the first location of the one or more charge storage structures and a source of gate voltage, and at least partly between the second location of the one or more charge storage structure and the source of gate voltage;
the charge control structure having:
a first node having a first charge type;
a second node having a second charge type opposite to the first charge type;
a third node having the first charge type;
a first junction separating the first node and the second node, the first junction adjacent to a part of the one or more storage dielectric structures at least partly between the first location of the one or more charge storage structures and the charge control structure;
a second junction separating the second node and the third node, the second junction adjacent to a part of the one or more storage dielectric structures at least partly between the second location of the one or more charge storage structures and the charge control structure,
wherein the charge control structure is vertically oriented with respect to a substrate of the integrated circuit, such that in a cross-section of the nonvolatile memory devices, the second node and the third node are further from the substrate than the first node, and the third node is further from the substrate than the second node.

26. An integrated circuit of a nonvolatile memory device storing data, comprising:
one or more charge storage means having a first location storing a first charge storage state and a second location storing a second charge storage state, the first charge storage state and the second charge storage state representing the data such that the first charge storage state and the second charge storage state each represent at least one bit of the data;
one or more storage dielectric means at least partly between the first location of the one or more charge storage means and a charge control means, at least partly between the second location of the one or more charge storage means and the charge control means, at least partly between the first location of the one or more charge storage means and a means of gate voltage, and at least partly between the second location of the one or more charge storage means and the means of gate voltage;
the charge control means having:
a first node having a first charge type;
a second node having a second charge type opposite to the first charge type;
a third node having the first charge type;
a first junction separating the first node and the second node, the first junction adjacent to a part of the one or more storage dielectric means at least partly between the first location of the one or more charge storage means and the charge control means;
a second junction separating the second node and the third node, the second junction adjacent to a part of the one or more storage dielectric means at least partly between the second location of the one or more charge storage means and the charge control means,
wherein the charge control means is vertically oriented with respect to a substrate of the integrated circuit, such that in a cross-section of the nonvolatile memory device, the second node and the third node are further from the substrate than the first node, and the third node is further from the substrate than the second node.

* * * * *